US010510425B2

(12) United States Patent
Kondo

(10) Patent No.: US 10,510,425 B2
(45) Date of Patent: Dec. 17, 2019

(54) SEMICONDUCTOR STORAGE DEVICE

(71) Applicant: Toshiba Memory Corporation, Tokyo (JP)

(72) Inventor: Shigeo Kondo, Yokkaichi Mie (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/921,123

(22) Filed: Mar. 14, 2018

(65) Prior Publication Data

US 2018/0277231 A1 Sep. 27, 2018

(30) Foreign Application Priority Data

Mar. 21, 2017 (JP) ................. 2017-054695

(51) Int. Cl.
| | |
|---|---|
| *G11C 16/34* | (2006.01) |
| *H01L 23/528* | (2006.01) |
| *G11C 16/10* | (2006.01) |
| *G11C 16/08* | (2006.01) |
| *G11C 16/24* | (2006.01) |
| *G11C 11/56* | (2006.01) |

(Continued)

(52) U.S. Cl.
CPC .......... *G11C 16/3459* (2013.01); *G11C 16/10* (2013.01); *H01L 23/528* (2013.01); *G11C 11/5671* (2013.01); *G11C 16/0466* (2013.01); *G11C 16/0483* (2013.01); *G11C 16/08* (2013.01); *G11C 16/24* (2013.01); *G11C 16/26* (2013.01); *G11C 2211/5621* (2013.01); *H01L 27/1157* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 7,436,733 B2 * | 10/2008 | Mokhlesi | G11C 7/02 257/E27.103 |
| 7,613,048 B2 | 11/2009 | Inoue et al. | |

(Continued)

FOREIGN PATENT DOCUMENTS

| | | |
|---|---|---|
| JP | 2008-117471 A | 5/2008 |
| JP | 2011-210337 A | 10/2011 |

(Continued)

*Primary Examiner* — Douglas King
(74) *Attorney, Agent, or Firm* — Finnegan, Henderson, Farabow, Garrett & Dunner, L.L.P.

(57) ABSTRACT

A word-line controller applies a voltage to a selected word-line. A bit-line controller applies voltages to bit-lines. A detector detects data of memory-cells. A write sequence of writing data in selected memory-cells connected to the selected word-line has at least one write-loop including a write operation of applying a plurality of write voltages with the word-line controller and the bit-line controller, and a verify operation of verifying with the detection circuit whether a threshold voltage of each of the selected memory-cells has reached a plurality of reference voltages for corresponding write data. The word-line controller and the bit-line controller select a write voltage corresponding to a threshold voltage of each of the selected memory-cells from among the write voltages with respect to each of the write-loops, and apply the selected write voltage to the selected memory-cell in a subsequent write operation.

15 Claims, 8 Drawing Sheets

(51) Int. Cl.
      *G11C 16/04*           (2006.01)
      *H01L 27/11582*    (2017.01)
      *G11C 16/26*          (2006.01)
      *H01L 27/1157*     (2017.01)

(56) References Cited

U.S. PATENT DOCUMENTS

| | | |
|---|---|---|
| 8,659,951 B2 | 2/2014 | Nawata |
| 2007/0153594 A1* | 7/2007 | Chen .................. G11C 11/5628 365/195 |
| 2009/0154238 A1* | 6/2009 | Lee .................... G11C 11/5628 365/185.03 |
| 2011/0069546 A1* | 3/2011 | Watanabe ........... G11C 11/5628 365/185.03 |
| 2014/0340964 A1 | 11/2014 | Shiino et al. |
| 2015/0262693 A1* | 9/2015 | Kondo ............... G11C 16/0483 365/185.12 |

FOREIGN PATENT DOCUMENTS

| | | |
|---|---|---|
| JP | 2013-84323 A | 5/2013 |
| JP | 2014-225310 A | 12/2014 |

* cited by examiner

SEMICONDUCTOR STORAGE DEVICE

CROSS REFERENCE TO RELATED APPLICATIONS

This application is based upon and claims the benefit of priority from the prior Japanese Patent Application No. 2017-054695, filed on Mar. 21, 2017, the entire contents of which are incorporated herein by reference.

FIELD

The embodiments of the present invention relate to a semiconductor storage device.

BACKGROUND

Multivalued memory cells such as a MLC (Multi-Level Cell) have been developed for non-volatile memories such as a NAND EEPROM (Electrically Erasable Programmable Read-Only Memory). Because the threshold value range of each level of data is relatively narrow in the MLC, the threshold value distribution of memory cells is demanded to be as narrow as possible.

DETAILED DESCRIPTION

A semiconductor storage device according to an embodiment includes a plurality of word lines, a plurality of bit lines, and a plurality of memory cells. A word line controller applies a voltage to a selected word line among the word lines. A bit line controller applies voltages to the bit lines, respectively. A detection circuit detects data of the memory cells by comparing threshold voltages of the memory cells with a reference voltage. A write sequence of writing data into selected memory cells connected to the selected word line has at least one write loop including a write operation of applying a plurality of write voltages with the word line controller and the bit line controller, and a verify operation of verifying with the detection circuit whether a threshold voltage of each of the selected memory cells has reached a plurality of reference voltages for corresponding write data. The word line controller and the bit line controller select a write voltage corresponding to a threshold voltage of each of the selected memory cells from among the write voltages with respect to each of the write loops, and apply the selected write voltage to the selected memory cell in a subsequent write operation.

Embodiments will now be explained with reference to the accompanying drawings. The present invention is not limited to the embodiments.

(First Embodiment)

Figure 1:
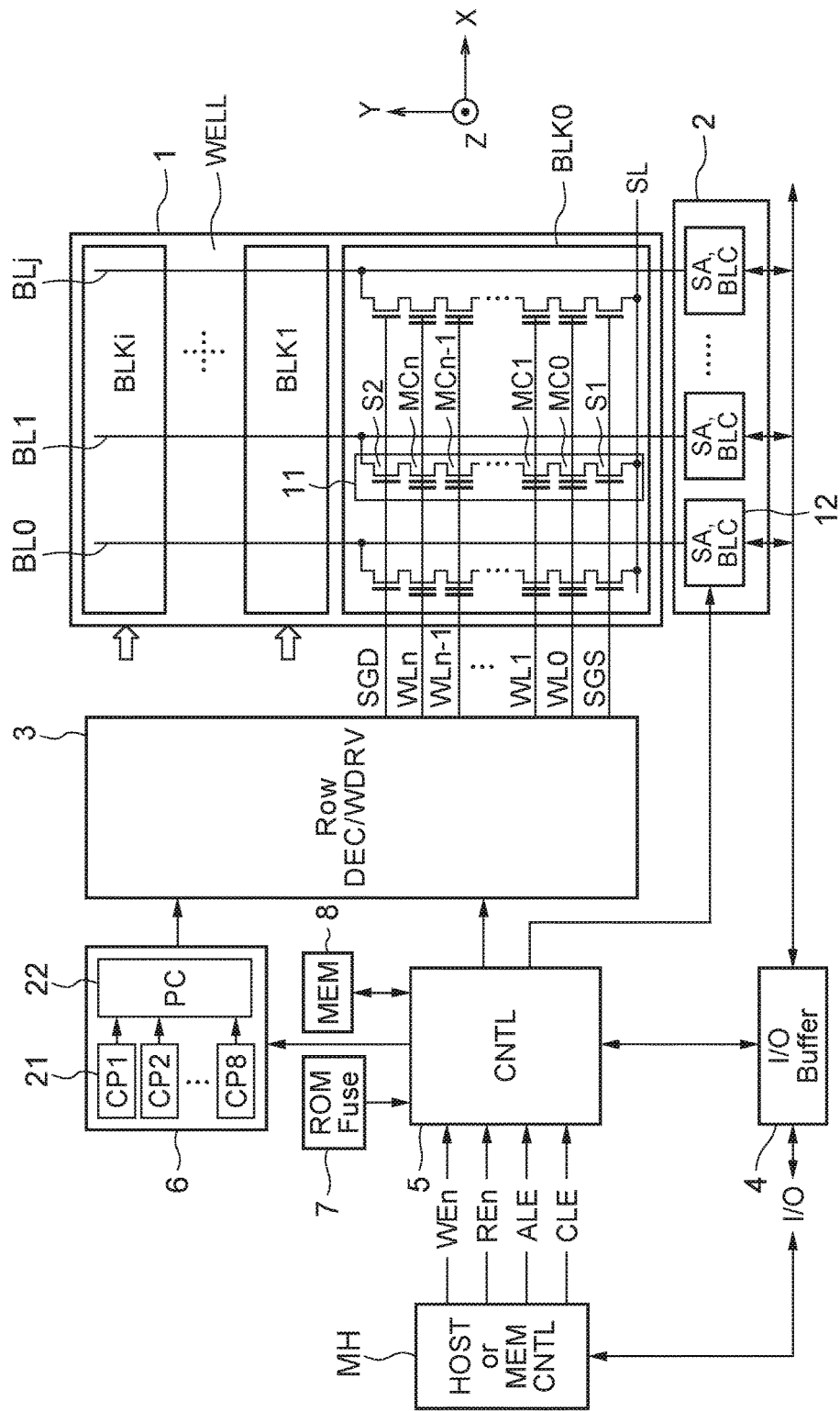
FIG. 1 illustrates an example of a configuration of a non-volatile semiconductor storage device according to a first embodiment.

FIG. 1 illustrates an example of a configuration of a non-volatile semiconductor storage device (hereinafter, also simply "memory") according to a first embodiment. The memory according to the first embodiment is, for example, a NAND EEPROM.

The memory according to the first embodiment includes a memory cell array 1, a sense amplifier circuit 2, a row decoder/word line controller 3, an input/output (I/O) buffer 4, a controller 5, a voltage generation circuit 6, a ROM fuse 7, and a data storage circuit 8.

The memory cell array 1 has a plurality of memory blocks BLK0 to BLKi (i is an integer equal to or larger than 2) formed on a same well. The memory cell array 1 can be a stereoscopic cell array in which memory cells are arrayed three-dimensionally or a planar cell array in which memory cells are arrayed two-dimensionally. Each of the memory blocks BLK is constituted of a plurality of NAND cell units 11 extending in a Y direction to be arrayed in an X direction as illustrated in FIG. 1. Each of the NAND cell units 11 includes a plurality of memory cells MC0 to MCn (n is an integer equal to or larger than 1, for example, n=70000) connected in series, and select transistors S1 and S2 connected to opposite ends thereof, respectively. The memory cells MC are provided to correspond to intersections between word lines WL and bit lines BL, respectively.

Word lines WL0 to WLn and select gate lines SGS and SGD for the memory block BLK0 are illustrated in FIG. 1. The word lines WL0 to WLn are connected to control gates of the corresponding memory cells MC0 to MCn, respectively, and all extend in the X direction. The select gate lines SGS and SGD are connected to gates of the select transistors S1 and S2, respectively, and all extend in the X direction. The word lines WL0 to WLn and the select gate lines SGS and SGD are shared by the NAND cell units 11 laying side by side in the X direction.

Sources of the select transistors S1 in the memory block BLK0 are connected to a same source line SL. Drains of the select transistors S2 in the memory block BLK0 are connected to corresponding bit lines BL0 to BLj (j is an integer equal to or larger than 2, for example, j=70000), respectively. As illustrated in FIG. 1, the source line SL extends in the X direction and the bit lines BL0 to BLj extend in the Y direction. In the following descriptions, the word lines WL0 to WLn, the bit lines BL0 to BLj, and the memory cells MC0 to MCn are also referred to simply as "word lines WL", "bit lines BL", and "memory cells MC", respectively.

The sense amplifier circuit 2 includes a sense amplifier SA and a bit line controller BLC. The sense amplifier SA serving as a detection circuit is a circuit that reads data from the memory cells MC through the corresponding bit lines BL. The sense amplifier SA compares a voltage corresponding to data in each of the memory cells MC with a reference voltage to detect logic of the data. The bit line controller BLC selectively drives the voltages of one or a plurality of the bit lines BL according to an address received from the controller 5. The bit line controller BLC controls the voltage or voltages of the selected bit line or bit lines BL to perform a write control operation, a verify read operation, or a read operation.

For example, the sense amplifier circuit 2 detects data stored in a selected memory cell MC connected to a selected word line WL and a selected bit line BL in the verify read operation and the read operation. The sense amplifier circuit 2 also includes a data latch circuit (not illustrated) and can temporarily retain the data detected by the sense amplifier SA.

The row decoder and word line controller (hereinafter, also simply "word line controller") 3 is a circuit that selects one of the word lines WL and the select gate lines SGS and SGD and applies a voltage to the word line WL or the select gate line SGS or SGD.

The I/O buffer 4 is a circuit that performs transfer of data between the sense amplifier circuit 2 and an external input/output terminal and that performs reception of command data or address data from the controller 5.

The controller 5 is a control unit that executes various types of control of the memory cell array 1. For example, the controller 5 receives an external control signal such as a write enable signal WEn, a read enable signal REn, an address-latch enable signal ALE, or a command-latch enable signal CLE from a host or a memory controller (MH) provided outside. According to the control signal, the controller 5 controls the word line controller 3, the sense amplifier circuit 2, the bit line controller BLC, and the like to perform an operation such as a write operation, a read operation, or an erase operation.

The voltage generation circuit 6 has a plurality of booster circuits 21 and a pulse generation circuit 22. The voltage generation circuit 6 changes the number of driven booster circuits 21 based on a control signal from the controller 5. The voltage generation circuit 6 controls the pulse generation circuit 22 to adjust the pulse width or pulse height of a pulse voltage.

The ROM fuse 7 is a storage unit in which setting values of the pulse width or the pulse height of the pulse voltage at the time of write or erase are stored. For example, the ROM fuse 7 has stored therein values of a write voltage (program voltage) Vpgm to be applied to a word line WL in a write operation, an increase width (a step-up width) ΔVpgm of the write voltage Vpgm, a bit line voltage Vch, a verify level, and the like. The write voltage Vpgm, the step-up width ΔVpgm, the bit line voltage Vch, the verify level, and the like can be provided from outside the memory.

The data storage circuit 8 is a rewritable non-volatile storage circuit in which various types of data to be used for control of the memory cell array 1 are saved. The write voltage Vpgm, the step-up width ΔVpgm, the bit line voltage Vch, the verify level, and the like can be stored in the data storage circuit 8.

Figure 2:
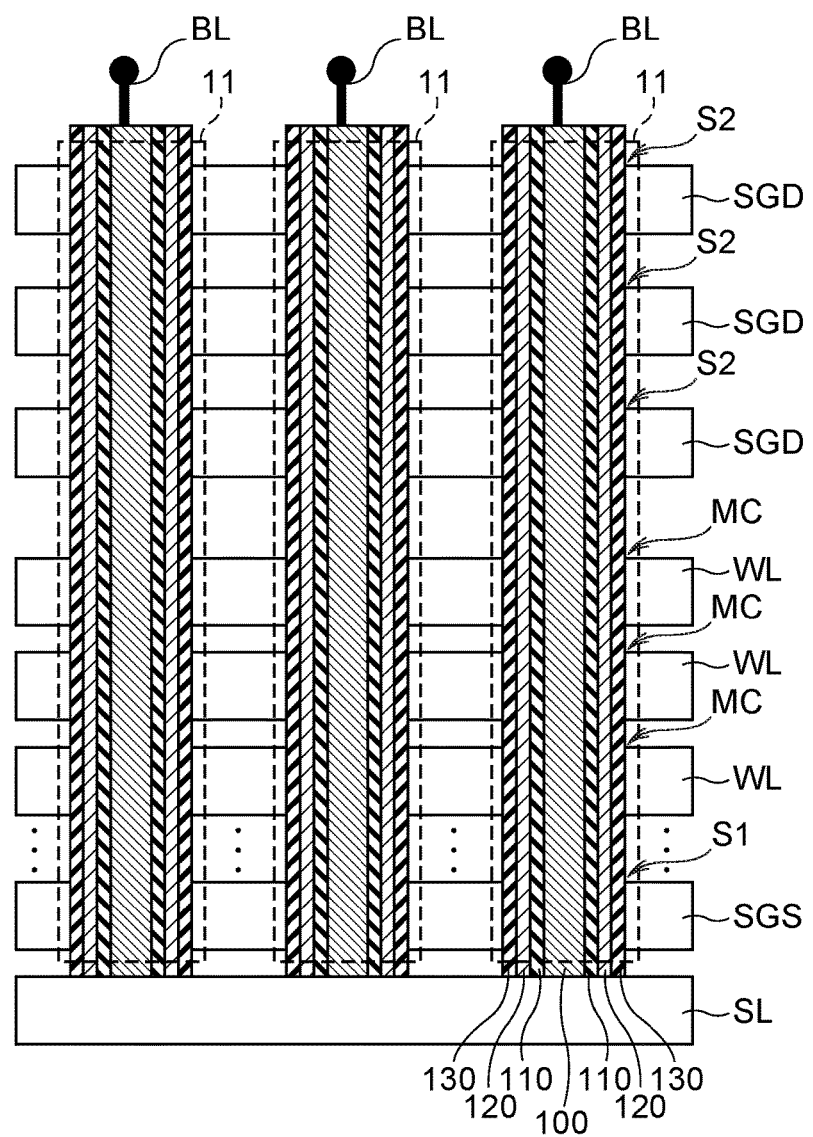
FIG. 2 is a schematic sectional view illustrating an example of the configuration of the NAND cell units.

FIG. 2 is a schematic sectional view illustrating an example of the configuration of the NAND cell units 11. FIG. 2 illustrates a stereoscopic memory cell array. However, it goes without saying that the memory cell array 1 can be a planar memory cell array.

Each of the NAND cell units 11 includes the memory cells MC connected in series and the two select transistors S1 and S2 connected to the opposite ends thereof, respectively. The select transistor S1 on the source side is connected to the source line SL and the select transistor S2 on the drain side is connected to the corresponding bit line BL. The select transistor S2 on the drain side is constituted of tree transistors connected in series while the number of the transistors is not limited thereto.

Each of the NAND cell units 11 includes a core 100, a tunnel film 110, a charge trap film 120, and a block film 130.

The core 100 functions as channel portions of the memory cells MC. For example, polysilicon is used for the core 100.

The tunnel film 110 causes charges to pass between the channel portions and the charge trap film 120 at the time of data write and data erase, and suppresses charges trapped by the charge trap film 120 from leaking to the channel portions. For example, a silicon dioxide film is used for the tunnel film 110.

The charge trap film 120 captures charges (electrons, for example) from the channel portions via the tunnel film 110 and traps the charges at the time of data write. By trapping charges into a part of the charge trap film 120 corresponding to a word line WL, data can be written into the corresponding memory cell MC. Conversely, at the time of data erase, the charge trap film 120 emits charges to the channel portions via the tunnel film 110. By emitting charges in a part of the charge trap film 120 corresponding to a word line WL, data in the corresponding memory cell MC can be erased. For example, a silicon nitride film is used for the charge trap film 120.

The block film 130 is provided between the charge trap film 120 and the word lines WL and functions to prevent charges trapped by the charge trap film 120 from leaking to the word lines WL. For example, a silicon dioxide film is used for the block film 130.

The core 100 has, for example, a pillar shape of a rectangular cylinder or circular cylinder. The tunnel film 110, the charge trap film 120, and the block film 130 are provided on the side surface of the core 100 and form a pillar structure as a whole.

The memory cells MC are provided to correspond respectively to intersecting portions between the word lines WL and the pillar structure described above. Therefore, by trapping charges in parts of the charge trap film 120 corresponding to the word lines WL, data can be written into the memory cells MC corresponding to the word lines WL, respectively.

The configurations of the select transistors S1 and S2 can be fundamentally identical to that of the memory cells MC. However, the select transistors S1 and S2 switch between on and off so as to cause electrical conduction or non-conduction between the channel portions of the core 100 and the bit lines BL or the source line SL. Therefore, a voltage to be applied to the select gate lines SGS and SGD is driven separately from the voltage of the word lines WL. For example, at the time of data erase, the select transistor S1 is turned on or off, whereby the NAND cell unit 11 is electrically connected to or disconnected from the source line SL. At the time of data write, the three transistors in the select transistor S2 are turned on or off, whereby the NAND cell unit 11 is electrically connected to or disconnected from the corresponding bit line BL.

An interlayer dielectric film (not illustrated) is embedded in spaces between adjacent ones of the NAND cell units 11 and spaces between adjacent ones of the word lines WL.

The numbers of the word lines WL, the bit lines BL, and the memory cells MC are not particularly limited. The memory cells MC can be any of SLCs (Single-Level Cells), MLCs (Multi-Level Cells), TLCs (Triple-Level Cells), QLCs (Quadruple-Level Cells), and more-level cells.

Figure 3:
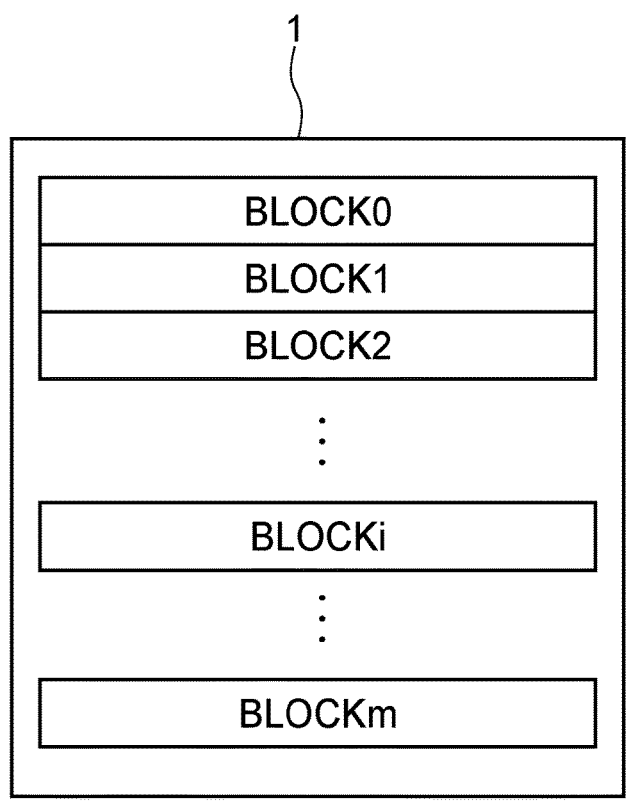
FIG. 3 illustrates the concept of blocks and pages of the memory cell array.

FIG. 3 illustrates the concept of blocks and pages of the memory cell array 1. The memory cell array 1 is divided into memory blocks (hereinafter, also "blocks") BLOCK0 to BLOCKm. In this example, the blocks BLOCK0 to BLOCKm are minimum units of data erase, respectively. Each of the blocks BLOCK0 to BLOCKm is constituted of a plurality of pages. The pages are units of data read or data write, respectively. Each of the pages corresponds to a word line WL and is constituted of data of a plurality of memory cells MC specified by a certain address.

A NAND EEPROM performs a write operation and a read operation in units of pages. That is, the bit line controller BLC can control bit lines BL in one page at the same time. The sense amplifier SA detects data of memory cells MC via the bit lines BL.

A write sequence of the memory is explained next.

A data write sequence is performed by iterating write loops each including a write operation and a verify operation. The write operation is an operation of applying a write voltage to a selected word line and increasing the threshold voltages of selected memory cells to write data therein. The verify operation is an operation of verifying whether the threshold voltages of selected memory cells have reached verify levels being reference voltages, that is, whether desired data has been written into the selected memory cells. In the following descriptions, a selected word line and selected memory cells are denoted by WL and MC, respectively, for convenience sake.

In a write sequence, with each iteration of a write loop, the word line controller 3 increases (steps up) the write voltage Vpgm to be applied to a selected word line WL by ΔVpgm. When the write voltage Vpgm then reaches a sufficiently high value, the threshold voltages of selected memory cells MC connected to the selected word line WL start increasing little by little to finally increase by almost ΔVpgm each time a write loop is performed.

When the threshold voltages of the selected memory cells MC gently increase, the threshold voltages of the selected memory cells MC gradually approaches verify levels (reference voltages) of respective write states and reach the verify levels at some stage in verify read. These selected memory cells MC are regarded to have passed (succeeded in) verification at this time. When the selected memory cells MC have passed verification, write in the selected memory cells MC ends and bit lines corresponding to the selected memory cells MC are brought to a non-selected state (write inhibit).

When data is written using a QPW (Quick Pass Write) method, a plurality of verify levels are used in each of the write states. In the general QPW method, when the threshold voltage of a selected memory cell MC exceeds a verify low level in a write loop, the bit line controller BLC increases the voltage Vch of a bit line BL corresponding to the selected memory cell MC having exceeded the verify low level by a voltage ΔVch (ΔVch=0 to 3ΔVpgm) approximately equivalent to ΔVpgm. This slows down the increase of the write voltage to be applied to the selected memory cell MC and increases the threshold voltage of the selected memory cell MC by small amounts in the write loop. When the threshold voltage of the selected memory cell MC thereafter exceeds a verify high level, the controller 5 ends the write sequence for the selected memory cell MC.

However, requirements for variation in the threshold voltage of the select transistors S2 on the drain side have become stricter in recent years and there is a case where the select transistors S2 do not operate normally when the voltage Vch of the bit lines BL is stepped up by small amounts. It is assumed, for example, that about 2 volts are applied to the select gate line SGD to bring the select transistors S2 to conduction. It is also assumed that the voltages Vch of bit lines BL corresponding to selected memory cells MC that have exceeded the verify low level are stepped up from 0 volt to 0.8 volt. In this case, the gate-drain voltage of the select transistors S2 is reduced from 2 volts to 1.2 volts. Therefore, there is a risk that the select transistors S2 are not sufficiently brought to the conduction state depending on variation in the threshold voltages of the select transistors S2.

Figure 4:
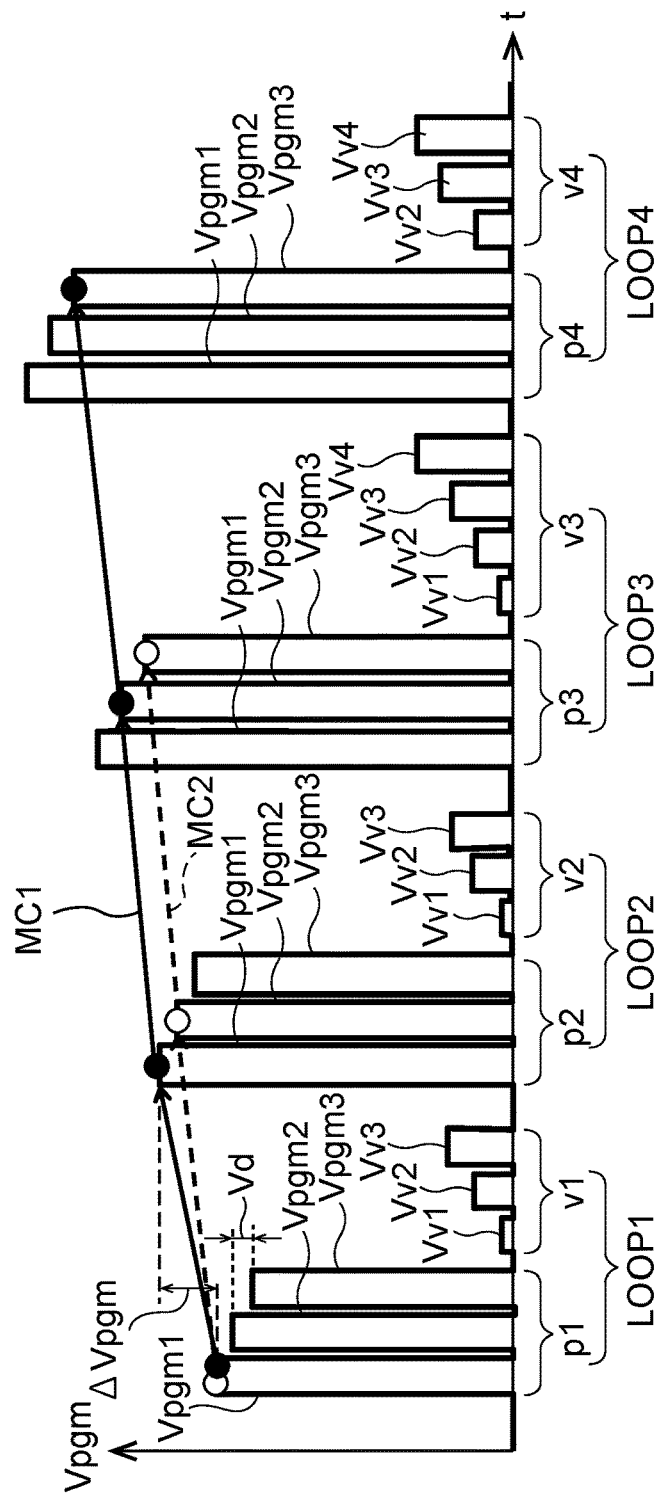
FIG. 4 is a graph illustrating write voltages for a word line according to the first embodiment.

In order to address this problem, the memory according to the first embodiment selects a write voltage corresponding to the threshold voltage of each of the selected memory cells MC from among a plurality of write voltages Vpgm1, Vpgm2, and Vpgm3 as illustrated in FIG. 4, without stepping up the bit line voltage, and applies the selected write voltage to the selected memory cell MC in the next write operation.

FIG. 4 is a graph illustrating write voltages for a word line WL according to the first embodiment. The vertical axis represents the voltage of a selected word line. The horizontal axis represents the time. In one write sequence, data (data of one or more pages stored in one word line) is written into selected memory cells MC of a plurality of columns connected to one selected word line WL. A write sequence includes a plurality of write loops. While four write loops LOOP1 to LOOP4 are illustrated in FIG. 4, one write sequence is not limited to four write loops and can be constituted of three or less write loops, or five or more write loops.

As illustrated in FIG. 4, the write loops LOOP1 to LOOP 4 include write operations p1 to p4 and verify operations v1 to v4, respectively. In the write operations p1 to p4, the word line controller 3 applies the three write voltages Vpgm1, Vpgm2, and Vpgm3 to each of selected memory cells MC1 and MC2 via a selected word line WL. In the verify operations v1 to v4, the word line controller 3 applies verify voltages Vv1, Vv2, and Vv3 corresponding to the respective write states to the selected memory cells MC1 and MC2 via the selected word line WL.

In any of the write loops LOOP1 to LOOP4, the second write voltage Vpgm2 is lower than the first write voltage Vpgm1, and the third write voltage Vpgm3 is lower than the second write voltage Vpgm2. That is, a magnitude relation Vpgm1>Vpgm2>Vpgm3 holds.

Each of the write voltages Vpgm1, Vpgm2, and Vpgm3 increases as the write loops progresses as LOOP1, LOOP2, LOOP3, and LOOP4. That is, each time a write loop is performed in the write sequence, the word line controller 3 increases the write voltages Vpgm1, Vpgm2, and Vpgm3 by predetermined values (hereinafter, also "step-up widths") ΔVpgm, respectively. The step-up widths ΔVpgm of the write voltages Vpgm1, Vpgm2, and Vpgm3 can be equal to each other. Therefore, the magnitude relation among the write voltages Vpgm1, Vpgm2, and Vpgm3 does not change in the write loops LOOP1 to LOOP4. The order of applying the write voltages Vpgm1, Vpgm2, and Vpgm3 in the write operations p1 to p4 can be changed. As long as the magnitude relation described above among the write voltages Vpgm1, Vpgm2, and Vpgm3 is kept, the step-up widths ΔVpgm of the write voltages Vpgm1, Vpgm2, and Vpgm3 can be different from each other. Furthermore, there is a case where application of voltages that have become unnecessary to be applied among the write voltages Vpgm1, Vpgm2, and Vpgm3 is omitted.

A solid line in FIG. 4 indicates changes in the write voltage for the selected memory cell MC1. A broken line indicates changes in the write voltage for the selected memory cell MC2. The write voltage for the selected memory cell MC1 is Vpgm1, Vpgm1, Vpgm2, and Vpgm3 in the write loops LOOP1 to LOOP4, respectively. The write voltage for the selected memory cell MC2 is Vpgm1, Vpgm2, Vpgm3 in the write loops LOOP1 to LOOP3, respectively. The write in the selected memory cell MC2 completes in the write loop LOOP3 and the selected memory cell MC2 is in a write inhibit state in the write loop LOOP4, which will be explained later.

The operation of the memory according to the first embodiment in a certain write sequence is explained below in more detail.

In the first embodiment, the memory cells MC can store 3-bit data therein. Therefore, for example, any of data of 8 states Er, A, B, C, D, E, F, and G is written into the memory cells MC. The magnitude relation among voltages in the respective states is Er<A<B<C<D<E<F<G. The state Er is an erase state.

The memory according to the first embodiment writes data into selected memory cells MC using the first write voltage Vpgm1, which is the highest among Vpgm1 to Vpgm3, until the threshold voltages of the selected memory cells MC exceed a verify low level (a verify low level A of the state A, for example). When the threshold voltages of the selected memory cells MC exceed the verify low level and do not exceed a verify high level (a verify high level A in the state A, for example), the memory writes data into the selected memory cells MC using the second write voltage Vpgm2 in the next write loop. When the threshold voltages of the selected memory cells MC then still do not exceed the verify high level, the memory according to the first embodiment writes data into the selected memory cells MC using the third write voltage Vpgm3 in the next write loop. Thereafter, the memory writes data into the selected memory cells MC using the third write voltage Vpgm3 until the selected memory cells MC finally pass the verify high level. Accordingly, data is written into the selected memory cells MC of all columns with the first write voltage Vpgm1 in the write loop LOOP1, data is written into the selected memory cells MC of the all columns with the first or second write voltage Vpgm1 or Vpgm2 in the write loop LOOP2, and data is written into the selected memory cells MC with any of the first to third write voltages Vpgm1 to Vpgm3 in the write loop LOOP3 and subsequent loops. The verify low level and the verify high level differ according to target write states (A to G) to be written into the selected memory cells MC. In the following descriptions, the verify low levels of the states A to G are referred to as "verify low levels A to G" and the verify high levels of the states A to G are referred to as "verify high levels A to G", respectively, for convenience sake. When selected memory cells MC have passed the verify high levels in the write loop LOOP1 or LOOP2, the selected memory cells MC are brought to a non-selected state (inhibit state) with respect to all write pulses in the next write loop and subsequent write loops.

(LOOP1)

At the initial time of a write sequence, the threshold voltages of the selected memory cells MC of all columns (the entire page) connected to the selected word line WL are low and the selected memory cells MC are in the erase state (the state Er). Therefore, the threshold voltages of selected memory cells MC of substantially all the columns connected to the selected word line WL are lower than the verify low level (the verify low level of the state A, which is the lowest) being a first reference voltage. In this case, in the write operation p1 of the first write loop LOOP1, the word line controller 3 and the bit line controller BLC select the first write voltage Vpgm1 highest among Vpgm1 to Vpgm3 and apply the selected voltage Vpgm1 to the selected memory cells MC via the selected word line WL. This enables the threshold voltages of selected memory cells MC of substantially all the columns to increase relatively greatly. For example, in the write loop LOOP1 illustrated in FIG. 4, the first write voltage Vpgm1 is applied to both the selected memory cells MC1 and MC2. This enables the threshold voltages of the selected memory cells MC1 and MC2 to be increased relatively greatly.

Bit lines BL corresponding to selected memory cells MC to which the first write voltage Vpgm1 is applied in the write operation p1 are brought to a write inhibit state (hereinafter, also "inhibit state") after the first write voltage Vpgm1 is applied thereto.

The inhibit state is a state in which the voltage of a bit line BL is increased to a third bit line voltage (about 2.5 volts, for example) sufficiently higher than the threshold voltage (about 1 volt, for example) of the select transistors S2 on the drain side to bring the select transistor S2 corresponding to the bit line BL of the column to a non-conduction state. When the select transistor S2 is brought to the non-conduction state, the bit line BL and the memory cell MC in the column are electrically disconnected from each other. Accordingly, the channel portion of the memory cell MC of the column is brought to a floating state and increases to, for example, 10 volts along with the selected word line WL when the write voltage is applied to the selected word line WL. This inhibits data from being written therein. For example, when the target write state is the state Er or when the threshold voltage of a selected memory cell MC has reached the verify high level of the target write state, the bit line controller BLC applies the third bit line voltage to a bit line BL corresponding to the selected memory cell MC in the next write operation to bring the bit line BL to the inhibit (non-selected) state.

In the write operation p1, after application of the first write voltage Vpgm1, the second and third write voltages Vpgm2 and Vpgm3 are also applied to the selected word line WL. At this time, bit lines BL of all the columns corresponding to memory cells MC to which the first write voltage Vpgm1 has been applied are in the inhibit state. Therefore, even when the second and third write voltages Vpgm2 and Vpgm3 are applied, data is not written into the memory cells MC of substantially all the columns on the selected word line. In the first write loop LOOP1, the word line controller 3 can omit application of the second and third write voltages Vpgm2 and Vpgm3.

Next, the verify operation v1 is performed. The verify operation is an operation of verifying whether the threshold voltages of the selected memory cells MC have reached the verify low levels and the verify high levels, that is, whether desired data has been written into the selected memory cells MC, respectively.

For example, it is assumed that the verify voltages Vv1 to Vv3 correspond to the verify high levels A, B, and C, respectively. In the verify operation v1, the word line controller 3 applies the verify voltages Vv1 to Vv3 to the selected memory cells MC in this order. It is supposed in this case that the threshold voltages of almost all the selected memory cells MC do not become the state D or a higher state in the write operation p1. Therefore, application of the verify voltages equal to or higher than Vv4 corresponding to the states D to G is omitted in the verify operation v1. The controller 5 successively determines whether the selected memory cells MC have passed the verify low level and the verify high level of the state A when the verify voltage Vv1 is applied thereto, and successively determines whether the selected memory cells MC have passed the verify low level and the verify high level of the state B when the verify voltage Vv2 is applied thereto. Similarly, the controller 5 successively determines whether the selected memory cells MC have passed the verify low level and the verify high level of each of the states C to G when each of the verify voltages Vv3 to Vv7 is applied thereto.

Each time the verify voltages Vv1 to Vv3 are applied sequentially, the sense amplifier SA detects data of the selected memory cell MC of each column. The controller 5 determines whether the threshold voltage of the selected memory cell MC has reached the predetermined verify low levels A to C and the verify high levels A to C based on logic of the read data, respectively. For example, in the following descriptions, it is assumed that the state A is written into the selected memory cell MC1 and the state C is written into the selected memory cell MC2. It is assumed that the threshold voltage of the selected memory cell MC1 is below the verify low level A in the write loop LOOP1. It is also assumed that the threshold voltage of the selected memory cell MC2 has reached the verify low level C while being below the verify high level C.

(LOOP2)

When the threshold voltages of the selected memory cells MC are below the verify low levels of respective write states being the first reference voltage (a case 0), the word line controller 3 and the bit line controller BLC select the first write voltage Vpgm1 from among Vpgm1 to Vpgm3 and apply the first write voltage Vpgm1 to the selected memory cells MC via the selected word line WL in the next write loop LOOP2. The first write voltage Vpgm1 in the write operation p2 is higher than the first write voltage Vpgm1 in the write operation p1 by the step-up width ΔVpgm. Therefore, the threshold voltages of the selected memory cells MC also increase by substantially the step-up widths ΔVpgm, respectively, in the write operation p2. For example, the threshold voltage of the selected memory cell MC1 is below the verify low level A as the first reference voltage. Therefore, as shown in FIG. 4, the word line controller 3 applies the first write voltage Vpgm1 to the selected memory cell MC1 in the write operation p2 of the write loop LOOP2.

When the threshold voltages of the selected memory cells MC reach the verify low levels of the respective write states and are below the verify high levels in the previous write loop LOOP1 (a case 1), the word line controller 3 and the bit line controller BLC select the second write voltage Vpgm2 from among Vpgm1 to Vpgm3 and apply the second write voltage Vpgm2 to the selected memory cells MC via the selected word line WL in the write operation p2 of the write loop LOOP2.

At this time, the second write voltage Vpgm2 in the write operation p2 is higher than the second write voltage Vpgm2 in the write operation p1 by the step-up width ΔVpgm. However, in the previous write loop, data has been written with the first write voltage Vpgm1 into the selected memory cells MC to which the second write voltage Vpgm2 is currently applied. Assuming that a voltage difference between the write voltage Vpgm1 and the write voltage Vpgm2 in a same write loop is Vd, an increase in the write voltage to be applied to the selected memory cells MC is reduced by the voltage difference Vd from the step-up width ΔVpgm. Therefore, the threshold voltages of the selected memory cells MC to which the second write voltage Vpgm2 is applied are increased not by ΔVpgm but by ΔVpgm-Vd from the first write voltage Vpgm1. That is, the memory according to the first embodiment can increase the threshold voltages of selected memory cells MC that have passed the verify low levels of respective write states and have not passed yet the verify high levels by small amounts in the next write loop. It is assumed in this case that 3×ΔVpgm>Vd>0. There is a case where Vd is larger than ΔVpgm. In such a case, the write voltages are maintained or stepped down and field effects applied to the selected memory cells MC are maintained or weakened. When the threshold voltages of the selected memory cells MC have not increased to the upper limit of the threshold voltages which can be reached with stepped-down write voltages, the threshold voltages of the selected memory cells MC may increase even if the write voltages are stepped down. Therefore, it is assumed that 3×ΔVpgm>Vd>0. The word line controller 3 and the bit line controller BLC thus perform a write operation using the second write voltage Vpgm2 lower than the first write voltage Vpgm1 to selected memory cells MC that have first passed the verify low levels in the previous write loop and have not passed yet the verify high levels. For example, the threshold voltage of the selected memory cell MC2 has first reached the verify low level A and is below the verify high level A in the write loop LOOP1. Therefore, as shown in FIG. 4, the word line controller 3 and the bit line controller BLC apply the second write voltage Vpgm2 to the selected memory cell MC2 in the write operation p2 of the write loop LOOP2.

When the first write voltage Vpgm1 is being applied to the selected word line to write data, memory cells MC in which data is written with the second write voltage Vpgm2 are in the inhibit state. Similarly, when the second write voltage Vpgm2 is being applied to the selected word line to write data, memory cells MC in which data is written with the first write voltage Vpgm1 are in the inhibit state. For example, because data is written with the second write voltage Vpgm2 into the memory cell MC2 that has first reached the verify low level C in the previous write loop and is below the verify high level C, the memory cell MC2 is in the inhibit state when the first write voltage Vpgm1 is being applied to the selected word line to write data therein. Because data is written with the first write voltage Vpgm1 in the selected memory cell MC1 that is below the verify low level A in the previous write loop, the memory cell MC1 is in the inhibit state when the second write voltage Vpgm2 is being applied to the selected word line to write data therein. Memory cells MC that have already reached the verify high levels of respective write states are in the inhibit state in subsequent loops.

In the first embodiment, the third write voltage Vpgm3 is also applied to the selected word line WL after application of the second write voltage Vpgm2. However, as described above, data has been written into all the memory cells MC on the selected word line with either the first write voltage Vpgm1 or the second write voltage Vpgm2 in the write loop LOOP2. Therefore, in the write loop LOOP2, all the bit lines BL are in the inhibit state when the third write voltage Vpgm 3 is being applied on the selected word line. The word line controller 3 can omit application of the third write voltage Vpgm3 in the write loop LOOP2.

Next, the verify operation v2 is performed. Because the verify operation v2 is identical to the verify operation v1, detailed explanations thereof are omitted. It is assumed that the threshold voltage of the selected memory cell MC1 has also reached the verify low level A in the write loop LOOP2.

(LOOP3)

When the threshold voltages of the selected memory cells MC are still below the verify low levels of the respective write states as the first reference voltage, the word line controller 3 and the bit line controller BLC select the first write voltage Vpgm1 from among Vpgm1 to Vpgm3 and apply the first write voltage Vpgm1 to the selected memory cells MC via the selected word line WL also in the write operation p3 of the write loop LOOP3, similarly to the case 0 described above of the write loop LOOP2. The first write voltage Vpgm1 in the write operation p3 is higher than the first write voltage Vpgm1 in the write operation p2 further by the step-up width ΔVpgm.

When the threshold voltages of the selected memory cells MC have first reached the verify low levels in the previous write loop LOOP2 and are below the verify high levels, the word line controller 3 and the bit line controller BLC select the second write voltage Vpgm2 from among Vpgm1 to Vpgm3 and apply the second write voltage Vpgm2 to the selected memory cells MC via the selected word line WL in the write operation p3 of the write loop LOOP3, similarly to the case 1 described above in the write loop LOOP2. While the second write voltage Vpgm2 in the write operation p3 is higher than the second write voltage Vpgm2 in the write operation p2 by the step-up width ΔVpgm, the threshold voltages of the selected memory cells MC increase by substantially ΔVpgm-Vd as described above. For example, the threshold voltage of the selected memory cell MC1 has first reached the verify low level A and is below the verify high level A in the write loop LOOP2. Therefore, as shown in FIG. 4, the word line controller 3 and the bit line controller BLC apply the second write voltage Vpgm2 to the selected memory cell MC1 in the write loop LOOP3.

When the threshold voltages of the selected memory cells MC have reached the verify low levels of the respective write states before the previous write loop LOOP2 and are below the verify high levels (a case 2), the word line controller 3 and the bit line controller BLC select the third write voltage Vpgm3 from among Vpgm1 to Vpgm3 and apply the third write voltage Vpgm3 to the selected memory cells MC via the selected word line WL in the write operation p3 of the write loop LOOP3. The third write voltage Vpgm3 in the write operation p3 is higher than the third write voltage Vpgm3 in the write operation p2 by the step-up width ΔVpgm.

The third write voltage Vpgm3 in the write operation p3 is higher than the third write voltage Vpgm3 in the write operation p2 by the step-up width ΔVpgm. However, the second write voltage Vpgm2 has been used rather than Vpgm3 in the previous write loop or therebefore to write data into selected memory cells MC to which the third write voltage Vpgm3 is applied in the write operation P3. Assuming that a voltage difference between the write voltage Vpgm2 and the write voltage Vpgm3 in a same write loop is Vd, an increase in the write voltage to be applied to the selected memory cells MC is reduced by the voltage difference Vd from the step-up width ΔVpgm. Therefore, the threshold voltages of the selected memory cells MC to which the third write voltage Vpgm3 is applied are increased by ΔVpgm-Vd rather than ΔVpgm from the second write voltage Vpgm2. The threshold voltages are increased by ΔVpgm-Vd consecutively in two write loops. That is, the memory according to the first embodiment can increase the threshold voltages of selected memory cells MC that have passed the corresponding verify low levels and have not passed the corresponding verify high levels by smaller amounts, respectively, in the subsequent write loop.

The threshold voltages of memory cells MC that still have not passed the verify high levels even after application of the third write voltage Vpgm3 are greatly increased because the write voltage is stepped up by ΔVpgm in subsequent write loops. However, the number of these memory cells MC is small and thus the influence thereof on the entire write state of the memory cell array is small.

As described above, the word line controller 3 and the bit line controller BLC perform the write operation using the third write voltage Vpgm3, which is the lowest among Vpgm1 to Vpgm3, for selected memory cells MC that have passed the verify low levels in a write loop (LOOP1, for example) before the previous write loop and have not passed yet the verify high levels. For example, the threshold voltage of the selected memory cell MC2 has exceeded the verify low level C in the write loop LOOP1, which is two or more loops before the write loop LOOP3, and is below the verify high level C in the write loop LOOP2, which is one loop before the write loop LOOP3. Therefore, as shown in FIG. 4, the word line controller 3 and the bit line controller BLC apply the third write voltage Vpgm3 to the selected memory cell MC2 in the write operation p3 of the write loop LOOP3. This enables the memory according to the first embodiment to increase the threshold voltages of selected memory cells MC by small amounts, respectively, after the respective verify low levels have been passed and until the respective verify high levels have been passed.

When the first write voltage Vpgm1 is being applied to the selected word line to write data, memory cells MC that data is to be written into with the second and third write voltages Vpgm2 and Vpgm3 are in the inhibit state. Similarly, when the second write voltage Vpgm2 is being applied to the selected word line to write data, memory cells MC that data is to be written into with the first and third write voltages Vpgm1 and Vpgm3 are in the inhibit state. When the third write voltage Vpgm3 is being applied to the selected word line to write data, memory cells MC that data is to be written into with the first and second write voltages Vpgm1 and Vpgm2 are in the inhibit state. For example, because data is to be written into the memory cell MC1 with the second write voltage Vpgm2, the memory cell MC1 is in the inhibit state when the first and third write voltages Vpgm1 and Vpgm3 are applied to the selected word line. Because data is to be written into the selected memory cell MC2 with the third write voltage Vpgm3, the selected memory cell MC2 is in the inhibit state when the first and second write voltages Vpgm1 and Vpgm2 are being applied to the selected word line.

Next, the verify operation v3 is performed. The verify operation v3 is fundamentally identical to the verify operation v1. However, in the verify operation v3, verify read is performed with the verify voltage Vv4 after being performed with the verify voltage Vv3. This is because write in the selected memory cells MC has progressed and the verify operation with the verify voltage Vv4 corresponding to the state D is required.

It is assumed that the selected memory cell MC2 has reached the target write state (the state C, for example) in the write loop LOOP3. That is, it is assumed that the selected memory cell MC2 has finally passed the verify high level C in the verify operation v3. Therefore, the bit line BL connected to the memory cell MC2 is in the inhibit state in the write loop LOOP4 and subsequent loops and a write operation for the memory cell MC2 is not performed.
(LOOP4)

When the threshold voltages of the selected memory cells MC are still below the verify low levels of the respective write states as the first reference voltage, the word line controller 3 and the bit line controller BLC select the first write voltage Vpgm1 from among Vpgm1 to Vpgm3 and apply the first write voltage Vpgm1 to the selected memory cells MC via the selected word line WL also in the write operation p4 of the write loop LOOP4, similarly to the case 0 described above in the write loop LOOP2. However, the first write voltage Vpgm1 in the write operation p4 is higher than the first write voltage Vpgm1 in the write operation p3 further by the step-up width ΔVpgm.

When the threshold voltages of the selected memory cells MC have first reached the verify low levels in the previous write loop LOOP3 and are below the verify high levels, the word line controller 3 and the bit line controller BLC select the second write voltage Vpgm2 from among Vpgm1 to Vpgm3 and apply the second write voltage Vpgm2 to the selected memory cells MC via the selected word line WL in the write operation p4 of the write loop LOOP4, similarly to the case 1 of the write loop LOOP2. While the second write voltage Vpgm2 in the write operation p3 is higher than the second write voltage Vpgm2 in the write operation p2 by the step-up width ΔVpgm, the threshold voltages of the selected memory cells MC increase by substantially ΔVpgm-Vd as described above.

When the threshold voltages of the selected memory cells MC have reached the verify low levels before the previous write loop LOOP3 and are below the verify high levels even in the write loop LOOP3, the word line controller 3 and the bit line controller BLC select the third write voltage Vpgm3 from among Vpgm1 to Vpgm3 and apply the third write voltage Vpgm3 to the selected memory cells MC via the selected word line WL in the write operation p4 of the write loop LOOP4, similarly to the case 2 of the write loop LOOP3. While the third write voltage Vpgm3 in the write operation p4 is higher than the third write voltage Vpgm3 in the write operation p3 by the step-up width ΔVpgm, the threshold voltages of the selected memory cells MC increase by substantially ΔVpgm-Vd as described above.

In this way, the word line controller 3 and the bit line controller BLC perform the write operation using the third write voltage Vpgm3, which is the lowest among Vpgm1 to Vpgm3, to selected memory cells MC that have passed the verify low levels of the respective write states in a write loop (LOOP1 or LOOP2, for example) two or more loops before the write loop LOOP4 and that have not passed the verify high levels in the previous write loop (LOOP3, for example). For example, the threshold voltage of the selected memory cell MC1 has exceeded the verify low level A and is not above the verify high level A in the write loop LOOP2. Therefore, as shown in FIG. 4, the word line controller 3 and the bit line controller BLC apply the third write voltage Vpgm3 to the selected memory cell MC1 in the write operation p4 of the write loop LOOP4. Thereafter, in write loops until the selected memory cell MC1 passes the verify high level A, the word line controller 3 and the bit line controller BLC apply the third write voltage Vpgm3 to the selected memory cell MC1 while stepping up the third write voltage Vpgm3. Accordingly, the memory according to the first embodiment can increase the threshold voltages of the selected memory cells MC by small amounts, respectively, until the verify high levels have been passed after the verify low levels have been passed. Similarly to the write loop LOOP3, memory cells MC written with the second or third write voltages Vpgm2 or Vpgm3 are in the inhibit state when the first write voltage Vpgm1 is being applied to the selected word line. When the second write voltage Vpgm2 is being applied to the selected word line, memory cells MC written with the first or third write voltages Vpgm1 or Vpgm3 are in the inhibit state. When the third write voltage Vpgm3 is being applied to the selected word line, memory cells MC written with the first or second write voltages Vpgm1 or Vpgm2 are in the inhibit state.

Next, the verify operation v4 is performed. The verify operation v4 is fundamentally identical to the verify operation v1. However, the verify voltage Vv1 is omitted in the verify operation v4. This is because all selected memory cells MC in which the state A and higher states are written have passed the verify high levels and do not require the verify voltage Vv1.

Thereafter, until data of the entire word line is written into the selected memory cells MC sufficiently, the memory iteratively performs the write loops. When write into selected memory cells MC of substantially all columns is completed in this manner, one write sequence (write of one word line) ends.

As described above, according to the first embodiment, the word line controller 3 and the bit line controller BLC write data into selected memory cells MC using the first write voltage Vpgm1 until the threshold voltages of the selected memory cells MC exceed the verify low levels of the respective write states. When the threshold voltages of the selected memory cells MC do not exceed the verify high levels after exceeding the verify low levels, the word line controller 3 and the bit line controller BLC write data into the selected memory cells MC using the second write voltage Vpgm2 in the first write loop thereafter. When the threshold voltages still do not exceed the verify high levels, the word line controller 3 and the bit line controller BLC write data into the selected memory cells MC using the third write voltage Vpgm3 in the second and subsequent write loops after the threshold voltages of the selected memory cells MC have exceeded the verify low levels. Thereafter, until the selected memory cells MC finally pass the verify high levels, the word line controller 3 and the bit line controller BLC write data into the selected memory cells MC using the third write voltage Vpgm3.

For example, data is written into the selected memory cell MC1 using the first write voltage Vpgm1 in the write loops LOOP1 and LOOP2 and the selected memory cell MC1 passes the verify low level and does not pass the verify high level in the write loop LOOP2. Thereafter, data is written into the selected memory cell MC1 using the second write voltage Vpgm2 in the following first write loop LOOP3 and using the third write voltage Vpgm3 in the second write loop LOOP4. As for the selected memory cell MC2, data is written therein using the first write voltage Vpgm1 in the write loop LOOP1 and the selected memory cell MC2 passes the verify low level and does not pass the verify high level in the write loop LOOP1. Thereafter, data is written into the selected memory cell MC2 using the second write voltage Vpgm2 in the following first write loop LOOP2 and using the third write voltage Vpgm3 in the second write loop LOOP3.

In this way, the word line controller 3 selects write voltages corresponding to the threshold voltages of the selected memory cells MC from among the write voltages Vpgm1 to Vpgm3 and applies the selected write voltages to the selected memory cells MC in the next write loop, respectively.

In a same write operation, the difference (Vd) between the write voltage Vpgm1 and the write voltage Vpgm2 can be equal to that between the write voltage Vpgm2 and the write voltage Vpgm3. However, the differences can be different as long as the magnitude relation (Vpgm1>Vpgm2>Vpgm3) is kept.

The number of write loops in one write sequence is not particularly limited.

Furthermore, the number of times of application of the second write voltage Vpgm2 to the selected memory cells MC having passed the verify low levels can be arbitrarily set. For example, the write voltages for selected memory cells MC that have passed the verify low levels are set as Vpgm2, Vpgm3, Vpgm3, Vpgm3, . . . . However, the write voltage Vpgm2 can be applied in a plurality of write loops. For example, the write voltages for selected memory cells MC that have passed the verify low levels can be set as Vpgm2, Vpgm2, Vpgm3, Vpgm3, Vpgm3, . . . .

Figure 5:
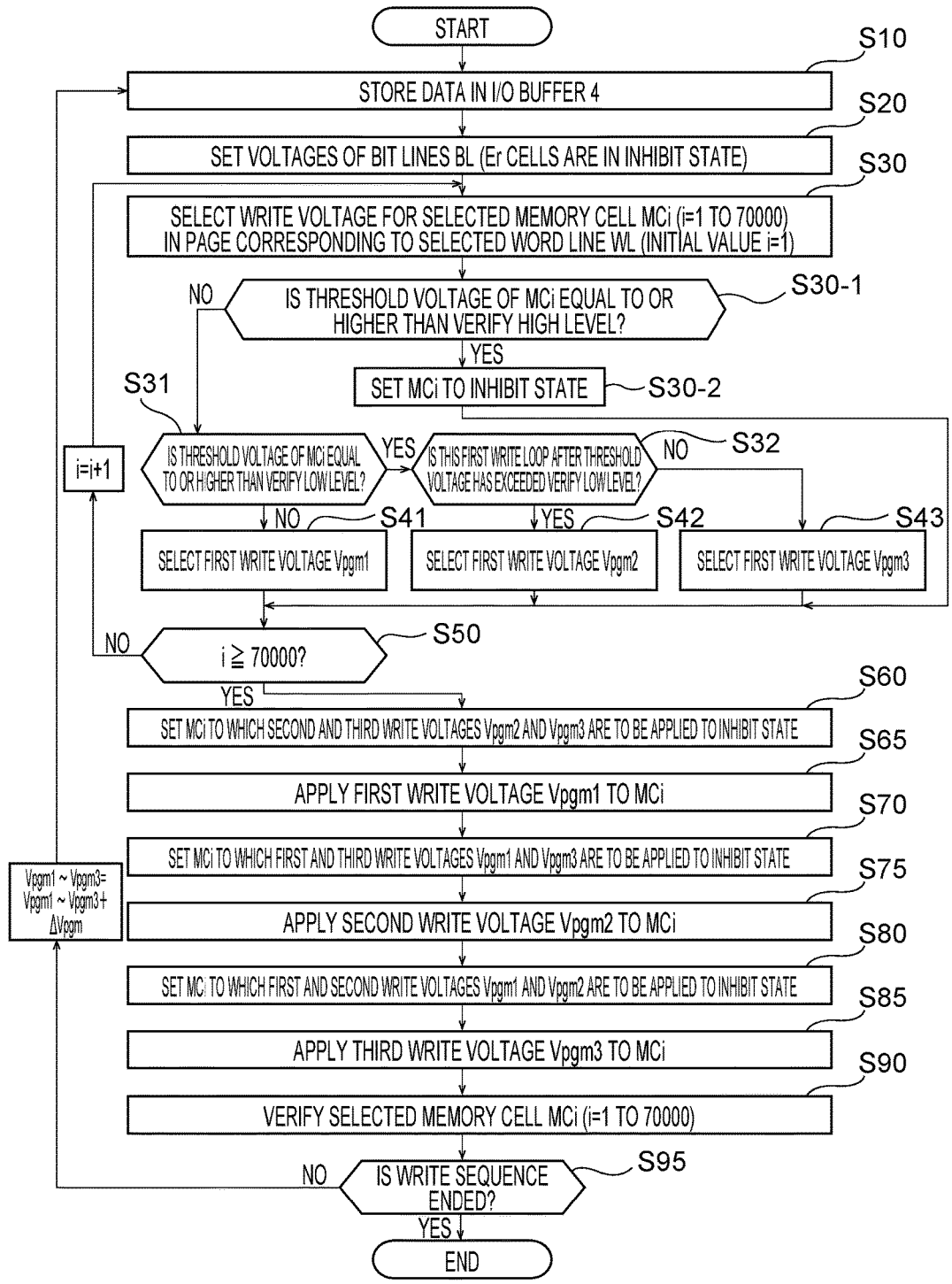
FIG. 5 is a flowchart illustrating an example of the write sequence according to the first embodiment.

FIG. 5 is a flowchart illustrating an example of the write sequence according to the first embodiment. Timings of selection of the write voltage and timings of application of the selected write voltage are explained with reference to FIG. 5.

First, data to be written into selected memory cells MC is stored in the I/O buffer 4 (Step S10).

Next, the bit line controller BLC applies a low level voltage to selected bit lines BL and fixes other non-selected bit lines BL at a high level voltage (Step S20). Accordingly, the non-selected bit lines BL are brought to the inhibit state. Selected bit lines BL connected to selected memory cells MC that the Er state is to be written into are also fixed at the high level voltage to be brought to the inhibit state.

Subsequently, one of the write voltages Vpgm1 to Vpgm3 is selected for a memory cell MCi (i=1 to 70000) on a selected word line WL (Step S30). The initial value of i is 1. While one word line has 70000 memory cells MC on it in the first embodiment, the number of memory cells MC on one word line is not limited thereto.

For example, the controller 5 determines whether the threshold voltage of the selected memory cell MCi is equal to or higher than the verify high level (Step S30-1). When the threshold voltage of the selected memory cell MCi has reached the verify high level (YES at Step S30-1), the selected memory cell MCi is brought to the inhibit state to be non-selected in all write loops (Step S30-2). When the threshold voltage of the selected memory cell MCi is below the verify high level (NO at Step S30-1), the controller 5 determines whether the threshold voltage of the selected memory cell MCi is equal to or higher than the verify low level (Step S31). When the threshold voltage of the selected memory cell MCi is below the verify low level (NO at Step S31), the controller 5 selects the first write voltage Vpgm1 (Step S41). At the initial time of a write sequence, the threshold voltages of memory cells MC of all columns (the entire word line) connected to the selected word line WL are in the erase state (the state Er). Therefore, in the first write loop, the controller 5 selects the first write voltage Vpgm1 for all selected memory cells MCi other than memory cells that are finally remained as the erase state.

When the threshold voltage of the selected memory cell MCi is equal to or higher than the verify low level and is lower than the verify high level (YES at Step S31), the controller 5 determines whether the current write loop is the first write loop after the threshold voltage of the selected memory cell MCi has exceeded the verify low level (Step S32). When the current write loop is the first write loop after the threshold voltage of the selected memory cell MCi has exceeded the verify low level (YES at Step S32), the controller 5 selects the second write voltage (Step S42).

When the current write loop is the second write loop after the threshold voltage of the selected memory cell MCi has exceeded the verify low level (NO at Step S32), the controller 5 selects the third write voltage Vpgm3 (Step S43). The number of write loops after the threshold voltage has exceeded the verify low level can be counted by a counter (not illustrated) provided in the controller 5 to store the count in an internal memory.

The controller 5 determines whether i has reached 70000 (Step S50). When i is below 70000 (NO at Step S50), the controller 5 repeats Steps S30 to S43. When i has reached 70000 (YES at Step S50), the controller 5 ends the selection process of the write voltages Vpgm1 to Vpgm3 for each of the selected memory cells MC. In this way, the write voltages Vpgm1 to Vpgm3 are determined for the selected memory cells MCi in the page corresponding to the selected word line WL.

Next, the controller 5 sets memory cells MCi to which the second and third write voltages Vpgm2 and Vpgm3 are to be applied to the inhibit state (Step S60). The memory cells set to the inhibit state at Step S30-2 or finally remained as the erase state are kept in the inhibit state.

Subsequently, the word line controller 3 and the bit line controller BLC apply the first write voltage Vpgm1 to selected memory cells MCi other than those in the inhibit state (Step S65). This enables the word line controller 3 to selectively apply the first write voltage Vpgm1 to the selected memory cells MCi to which the first write voltage Vpgm1 is set to be applied at Step S41.

Next, the controller 5 sets memory cells MCi to which the first and third write voltages Vpgm1 and Vpgm3 are to be applied and the memory cells that are finally remained as the erase state to the inhibit state (Step S70). The memory cells set to the inhibit state at Step S30-2 or finally remained as the erase state are kept in the inhibit state.

Next, the word line controller 3 and the bit line controller BLC apply the second write voltage Vpgm2 to selected memory cells MCi other than those in the inhibit state (Step S75). This enables the word line controller 3 and the bit line controller BLC to selectively apply the second write voltage Vpgm2 to the selected memory cells MC to which the second write voltage Vpmg2 is set to be applied at Step S42.

Next, the controller 5 sets selected memory cells MCi to which the first and second write voltages Vpgm1 and Vpgm2 are to be applied to the inhibit state (Step S80). The memory cells set to the inhibit state at Step S30-2 or finally remained as the erase state are kept in the inhibit state.

Next, the word line controller 5 and the bit line controller BLC apply the third write voltage Vpgm3 to selected memory cells MCi other than those in the inhibit state (Step S85). This enables the word line controller 3 and the bit line controller BLC to selectively apply the third write voltage Vpgm3 to the selected memory cells MC to which the third write voltage Vpgm3 is set to be applied at Step S43.

Next, the controller 5 performs the verify operation to each of the selected memory cells MCi (Step S90). With the verify operation, the controllers 5 can verify whether the threshold voltage of each of the selected memory cells MC has reached the verify low level and the verify high level of the relevant write state.

When the number of selected memory cells MC below the respective verify high levels is above a predetermined number, the write sequence proceeds to the next write loop (NO at Step S95). In this case, the controller 5 increases the first to third write voltages Vpgm1 to Vpgm3 by the step-up widths ΔVpgm, respectively.

In the next write loop, the controller 5 brings memory cells MC that have reached the target write states to the inhibit state at Step S30-2.

When the number of selected memory cells MC to which write has not ended yet is equal to or smaller than the predetermined number, the write sequence ends (YES at Step S95).

As described above, according to the first embodiment, the word line controller 3 and the bit line controller BLC write data into the selected memory cells MC using the first write voltage Vpgm1 until the threshold voltages of the selected memory cells MC exceed the verify low levels of the respective write states. When the threshold voltages of the selected memory cells MC are below the respective verify high levels after having exceeded the respective verify low levels, the word line controller 3 writes data into the selected memory cells MC using the second write voltage Vpgm2 in the first write loop. When the threshold voltages are still below the respective verify high levels, the word line controller 3 writes data into the selected memory cells MC using the third write voltage Vpgm3 in the second and subsequent write loops after the threshold voltages of the selected memory cells MC have exceeded the respective verify low levels. Thereafter, the word line controller 3 writes data into the selected memory cells MC using the third write voltage Vpgm3 until the selected memory cells MC finally pass the verify high levels.

That is, according to the first embodiment, the controller 5 selects the write voltage from among the write voltages Vpgm1, Vpgm2, and Vpgm3 in the next write operations p1 to p4 based on the threshold voltages of the selected memory cells MC. The word line controller 3 and the bit line controller BLC apply the selected write voltage (any of Vpgm1, Vpgm2, and Vpgm3) to the selected memory cells MC via the selected word line WL.

The write voltages Vpgm1 to Vpgm3 are increased by the step-up widths ΔVpgm, respectively, for each write loop. The write voltages Vpgm1 to Vpgm3 in a same write loop are lowered by the voltage differences Vd, respectively. Therefore, a difference between the first write voltage Vpgm1 in a certain write loop and the second write voltage Vpgm2 in the next write loop is ΔVpgm-Vd and is smaller than the step-up width ΔVpgm (reduced). A difference between the second write voltage Vpgm2 in a certain write loop and the third write voltage Vpgm3 in the next write loop is ΔVpgm-Vd and is smaller than the step-up width ΔVpgm (reduced).

For example, as in the selected memory cell MC2, by performing write with the first write voltage Vpgm1 in the write loop LOOP1 and performing write with the second write voltage Vpgm2 in the next write loop LOOP2, the step-up width of the write voltage for the selected word line WL is substantially reduced from ΔVpgm to (ΔVpgm-Vd). This enables narrowing the distribution of the threshold voltages of the selected memory cells MC of respective write states similarly to the general QPW method described above, in which the bit line voltage Vch is stepped up by small amounts. The voltage difference Vd can be substantially equal to the step-up width of the bit line voltage Vch.

As described above, the memory according to the first embodiment can narrow the threshold voltage distribution of the selected memory cells MC of the respective write states even when the bit line voltage of write-incomplete memory cells are fixed to the source voltage or the ground voltage. That is, the memory according to the first embodiment can achieve the same function and effect as the traditional QPW method without stepping-up the bit line voltage Vch. Therefore, the voltages of selected bit lines and non-selected bit lines in the inhibit state can be separated enough from each other, which can suppress an erroneous operation of the select transistors S2 even when the threshold voltages of the select transistors S2 are distributed in some extent.

In order to make the select gate SGD illustrated in FIG. 1 conductive, the bit line voltages need to be lower than the threshold voltage of the select gate SGD. In order to make the select gate SGD non-conductive, the bit line voltages need to be higher than the threshold voltage of the select gate SGD. Meanwhile, only the same gate voltage can be applied to the gate electrodes of the select gate line SGD because the gate electrodes are common to the columns. Therefore, it is preferable that the voltages of the selected bit lines and the non-selected bit lines be sufficiently separated from each other to accurately control conductivity of the select gate SGD with the voltages of the bit lines even when the threshold voltage of the select gate line SGD varies among the columns.

According to the first embodiment, as described above, the voltages of the selected bit lines and the non-selected bit lines can be sufficiently separated. Therefore, greater distribution of the threshold voltages of the select transistors S2 is allowed than the traditional QPW method without unintended leakage or cut-off of the select transistors. Thus, it is possible to suppress the select transistors on the drain side of the selected bit lines from erroneously becoming non-conductive or suppress the select transistors on the drain side of the non-selected bit lines from erroneously becoming conductive.

(Second Embodiment)

The memory according to the first embodiment selects the write voltages corresponding to the threshold voltages of the selected memory cells MC from among the write voltages Vpgm1 to Vpgm3 and apply the selected write voltages to the selected memory cells MC, respectively, in the next write loop. In this case, the bit line voltages of write-incomplete memory cells MC are fixed to the source voltage or the ground voltage and is not stepped up or down.

In contrast thereto, the second embodiment presents a memory where the voltage of the bit lines BL is also stepped up or down as well as the write voltages are selected from one or more values. In other words, the second embodiment can be called as a hybrid QPW method including selection of the write voltages and the bit line voltages. The configurations of the memory according to the second embodiment are identical to the first embodiment, and thus descriptions thereof will be omitted.

Figure 6:
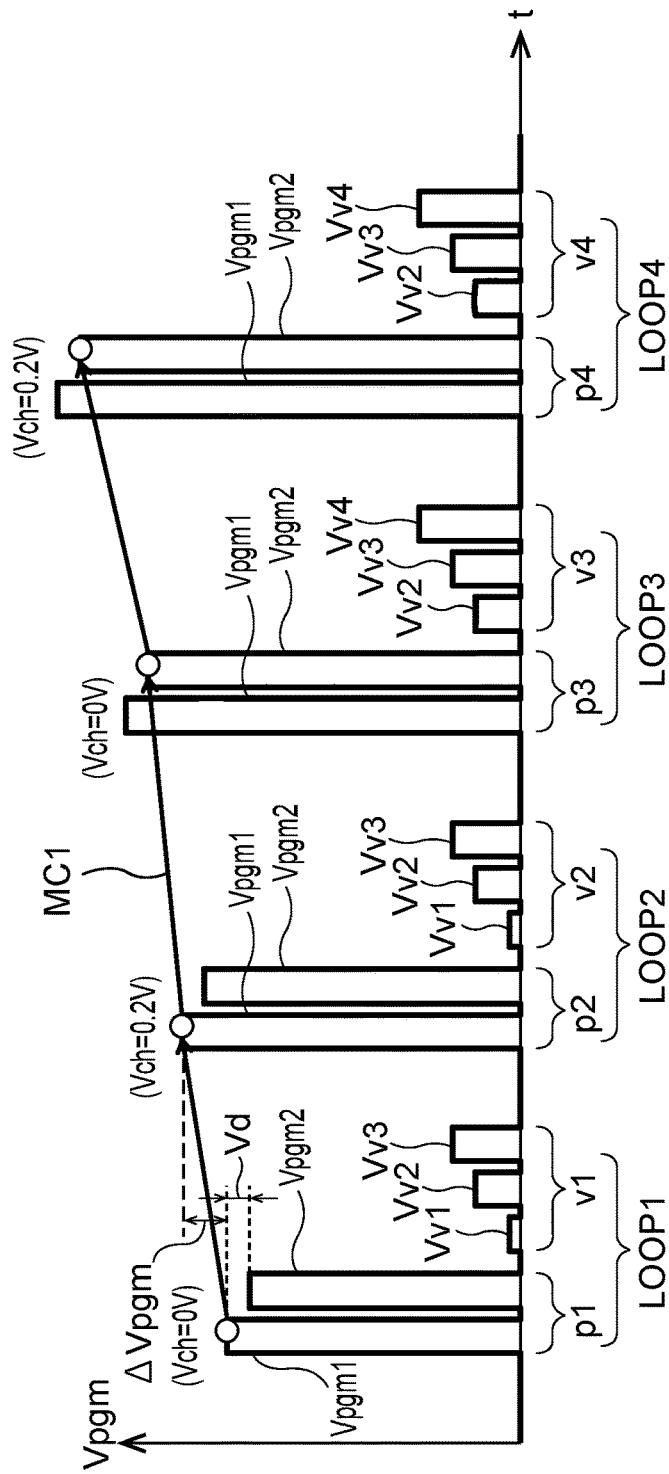
FIG. 6 is a graph illustrating write voltages for a word line WL according to the second embodiment.

FIG. 6 illustrates write voltages applied to a selected word line WL according to the second embodiment. The second embodiment differs from the first embodiment in that two write voltages Vpgm1 and Vpgm2 are applied in one write loop. At the same time, the bit line voltage Vch can be stepped up or down in the second embodiment. Therefore, selection of the write voltages Vpgm1 and Vpgm2 and selection of the bit line voltage Vch can be combined. A step-up width (voltage difference) of the bit line voltage Vch is smaller than three times the step-up width ΔVpgm of the word line WL (3×ΔVpgm>voltage difference of Vch>0) similarly to the voltage difference Vd.

For example, a following write sequence can be performed. The verify operation in the second embodiment is identical to that in the first embodiment and thus descriptions thereof will be omitted.

(LOOP1)

At an initial time of a write sequence, the threshold voltages of selected memory cells MC of all columns connected to a selected word line WL are lower than the verify low levels of respective write states as a first reference voltage. In this case, in the write operation p1 of the first write loop LOOP1, the word line controller 3 and the bit line controller BLC select the first write voltage Vpgm1, which is the highest of Vpgm1 and Vpgm2, and apply the first write voltage Vpgm1 to the selected memory cells MC via the selected word line WL. At this time, the voltage Vch of the bit lines BL is kept at the source voltage or the ground voltage being a first bit line voltage and is 0 volts, for example. In the write loop LOOP1 in FIG. 6, the first write voltage Vpgm1 is applied to the selected memory cell MC1 while the voltage of the bit line BL is kept at the source voltage or the ground voltage (0 volts).
(LOOP2)

When the threshold voltages of the selected memory cells MC are below the verify low levels of the respective write states as the first reference voltage (a case 0), the word line controller 3 and the bit line controller BLC select the first write voltage Vpgm1 to be applied to the selected memory cells MC via the selected word line WL in the next write loop LOOP2. At this time, the bit line voltage Vch is still kept to 0 volts. The first write voltage Vpgm1 in the write operation p2 is higher than the first write voltage Vpgm1 in the write operation p1 by the step-up width ΔVpgm.

When the threshold voltages of the selected memory cells MC have reached the verify low levels in the previous write loop LOOP1 and are below the verify high levels (a case 1), the word line controller 3 and the bit line controller BLC select the first write voltage Vpgm1 to be applied to the selected memory cells MC via the selected word line WL in the write operation p2 of the write loop LOOP2. At this time, the bit line controller BLC steps up the bit line voltage Vch to a second bit line voltage (0.2 volts, for example) higher than the first bit line voltage. This increases the write voltages to be applied between the word line and the channels of the selected memory cells MC by ΔVpgm-Vch from Vpgm1 in the write loop LOOP1 and reduces the increase width. Accordingly, the threshold voltages of selected memory cells MC that have passed the verify low levels and are below the verify high levels can be increased by small amounts in the next write loop.

For example, in the following descriptions, it is assumed that the state A is written into the selected memory cell MC1 and the state C is written into the selected memory cell MC2. It is also assumed that the threshold voltage of the selected memory cell MC1 is above the verify low level A and is still below the verify high level A in the write loop LOOP1. In this case, the word line controller 3 and the bit line controller BLC apply the first write voltage Vpgm1 to the selected memory cell MC1 in the write loop LOOP2. Along therewith, the bit line controller BLC increases the voltage Vch of the bit line BL connected to the selected memory cell MC1 to 0.2 volts, for example. This enables the threshold voltage of the selected memory cell MC1 to be increased by a small amount.
(LOOP3)

In the case 0 described above, the word line controller 3 and the bit line controller BLC select the first write voltage Vpgm1 to be applied to the selected memory cells MC via the selected word line WL also in the write operation p3 of the write loop LOOP3. The first write voltage Vpgm1 in the write operation p3 is higher than the first write voltage Vpgm1 in the write operation p2 further by the step-up width ΔVpgm.

In the case 1 described above, the word line controller 3 and the bit line controller BLC select the first write voltage Vpgm1 to be applied to the selected memory cells MC via the selected word line WL in the write operation p3 of the write loop LOOP3. At this time, the bit line controller BLC steps up the bit line voltage Vch to 0.2 volts, for example. Therefore, the write voltage to be applied between the word line and the channels of the selected memory cells MC is increased by ΔVpgm-Vch from Vpgm1 in the write loop LOOP2 and the increase width is reduced. Accordingly, the threshold voltages of selected memory cells MC that have passed the verify low levels can be increased by small amounts, respectively, in the next write loop.

When the threshold voltages of the selected memory cells MC have reached the verify low levels of the respective write states before the previous write loop LOOP2 and are below the verify high level in the previous write loop LOOP2 (a case 2), the word line controller 3 and the bit line controller BLC select the second write voltage Vpgm2 from Vpgm1 and Vpgm2 and apply the second write voltage Vpgm2 to the selected memory cells MC via the selected word line WL in the following write loop LOOP3. At this time, the voltage Vch of the bit lines BL is pulled down to 0 volts.

The second write voltage Vpgm2 in the write operation p3 is higher than the second write voltage Vpgm2 in the write operation p2 by the step-up width ΔVpgm. However, the first write voltage Vpgm1 and the stepped-up bit line voltage Vch (0.2 volts) have been used rather than the second write voltage Vpgm2 in the previous write loop or therebefore to write data into the selected memory cells MC to which the second write voltage Vpgm2 is applied in the write operation p3. Therefore, the step-up width of the write voltage to be applied to the selected memory cells MC is reduced by (Vd−Vch) and the threshold voltages of the selected memory cells MC are increased by (ΔVpgm-Vd+Vch) from the previous write loop LOOP2.

For example, the threshold voltage of the selected memory cell MC1 is assumed to have exceeded the verify low level A in the write loop LOOP1, which is two or more loops before the write loop LOOP3, and is still below the verify high level A also in the write loop LOOP2. Therefore, as shown in FIG. 6, the word line controller 3 and the bit line controller BLC apply the second write voltage Vpgm2 to the selected memory cell MC1 in the write operation p3 of the write loop LOOP3. Here the bit line controller BLC sets the bit line voltage to 0 volts.
(LOOP4)

In the case 0, the word line controller 3 and the bit line controller BLC select the first write voltage Vpgm1 and apply the first write voltage Vpgm1 to the selected memory cells MC via the selected word line WL also in the write operation P4 of the write loop LOOP4. The first write voltage Vpgm1 in the write operation p4 is higher than the first write voltage Vpgm1 in the write operation p3 further by the step-up width ΔVpgm.

In the case 1, the word line controller 3 and the bit line controller BLC select the first write voltage Vpgm1 and apply the first write voltage Vpgm1 to the selected memory cells MC via the selected word line WL in the write operation p4 of the write loop LOOP4. Besides, the bit line controller BLC steps up the bit line voltage Vch to 0.2 volts, for example. Therefore, the first write voltage Vpgm1 is effectively increased by ΔVpgm-Vch from Vpgm1 in the write loop LOOP3 and the increase width is reduced.

In the case 2, the word line controller 3 and the bit line controller BLC select the second write voltage Vpgm2 and apply the second write voltage Vpgm2 to the selected memory cells MC via the selected word line WL in the write operation p4 of the write loop LOOP4. The bit line voltage Vch is set to 0 volts. The second write voltage Vpgm2 in the write operation p4 is higher than the second write voltage Vpgm2 in the write operation p3 by the step-up width ΔVpgm. However, the step-up width of the write voltage to be applied between the word line and the channels of the selected memory cells MC is reduced by (Vd−Vch) and the threshold voltages of the selected memory cells MC are increased by (ΔVpgm-Vd+Vch) from the write loop LOOP3.

When the threshold voltages of the selected memory cells MC have reached the verify low levels three write loops before the current write loop LOOP4 (LOOP1, for example) and are still below the verify high levels in the previous write loop LOOP3 (a case 3), the word line controller 3 and the bit line controller BLC select the second write voltage Vpgm2 from Vpgm1 and Vpgm2 and apply the second write voltage Vpgm2 to the selected memory cells MC via the selected word line WL in the third write loop LOOP4. Furthermore, the bit line controller BLC sets the bit line voltage Vch to 0.2 volts, for example. Accordingly, the threshold voltages of the selected memory cells MC are increased by ΔVpgm-Vch from the previous write loop LOOP3 and the increase width is reduced.

For example, it is assumed that the threshold voltage of the selected memory cell MC1 has exceeded the verify low level A in the write loop LOOP1, which is three write loops before the current write loop LOOP4, and is still below the verify high level A in the subsequent two write loops LOOP2 and LOOP3. In this case, the word line controller 3 and the bit line controller BLC apply the second write voltage Vpgm2 to the selected memory cell MC1 in the write loop LOOP4. Along therewith, the bit line controller BLC increases the voltage Vch of the bit line BL connected to the selected memory cell MC1 to 0.2 volts, for example.

In subsequent write loops, the word line controller 3 and the bit line controller BLC apply the second write voltage Vpgm2 to the selected memory cell MC1, and the bit line voltage Vch (0.2 volts) to the corresponding bit lines until the threshold voltage passes the verify high level, while stepping up the second write voltage Vpgm2.

Thereafter, until data of the entire word line is written into the selected memory cells MC sufficiently, the memory iteratively performs the write loops.

When write in the selected memory cells MC of substantially all columns is completed in this manner, one write sequence (write of one word line) ends.

As described above, according to the second embodiment, the write voltage for the selected word line WL is set to Vpgm1 and the voltage of the selected bit lines BL is kept at the source voltage or the ground voltage until the threshold voltages of the selected memory cells MC exceed the verify low levels of the respective write states.

When the threshold voltages of the selected memory cells MC have exceeded the verify low level first and are below the verify high level, the word line controller 3 and the bit line controller BLC set the write voltage for the selected word line WL to Vpgm1 and biases the voltage Vch of the selected bit lines BL to 0.2 volts, for example, in the first write loop thereafter.

When the threshold voltages of the selected memory cells MC still do not exceed the verify high levels in the following write loop, the word line controller 3 and the bit line controller BLC set the write voltage for the selected word line WL to Vpgm2 and keep the voltage Vch of the selected bit lines BL at the source voltage or the ground voltage in the second write loop after the threshold voltages have exceeded the verify low levels.

When the threshold voltages of the selected memory cells MC still do not exceed the verify high levels in the further following write loop, the word line controller 3 and the bit line controller BLC set the write voltage for the selected word line WL to Vpgm2 and increase the voltage Vch of the selected bit lines BL to 0.2 volts, for example, in the third write loop after the threshold voltages have exceeded the verify low levels.

Thereafter, until the selected memory cells MC finally pass the verify high levels, the word line controller 3 and the bit line controller BLC set the write voltage for the selected word line WL to Vpgm2 and set the voltage Vch of the selected bit lines BL to 0.2 volts, for example.

In this way, the word line controller 3 and the bit line controller BLC select write voltages corresponding to the threshold voltages of the selected memory cells MC from the write voltages Vpgm1 and Vpgm2 and apply the selected write voltages to the selected memory cells MC, respectively, in the next write loop. Along therewith, the bit line controller BLC selects bit line voltages corresponding to the threshold voltages of the selected memory cells MC from the bit line voltages Vch (0 volts and 0.2 volts) and applies the selected bit line voltages to the selected memory cells MC, respectively, in the next write loop. According to the second embodiment, while the voltage of the bit lines BL is stepped up or down, the increase width can be a small value. Therefore, the threshold voltage distributions of write-verified memory cells can be reduced from the traditional QPW method without reduction of a voltage difference between selected bit lines and non-selected bit lines in the inhibit state. Accordingly, the second embodiment also can provide identical effects to those in the first embodiment.

The write voltages and the bit line voltages for the selected memory cells MC that have passed the verify low levels can be arbitrarily set as long as the threshold voltages of the selected memory cells MC increase for each write loop.

Figure 7:
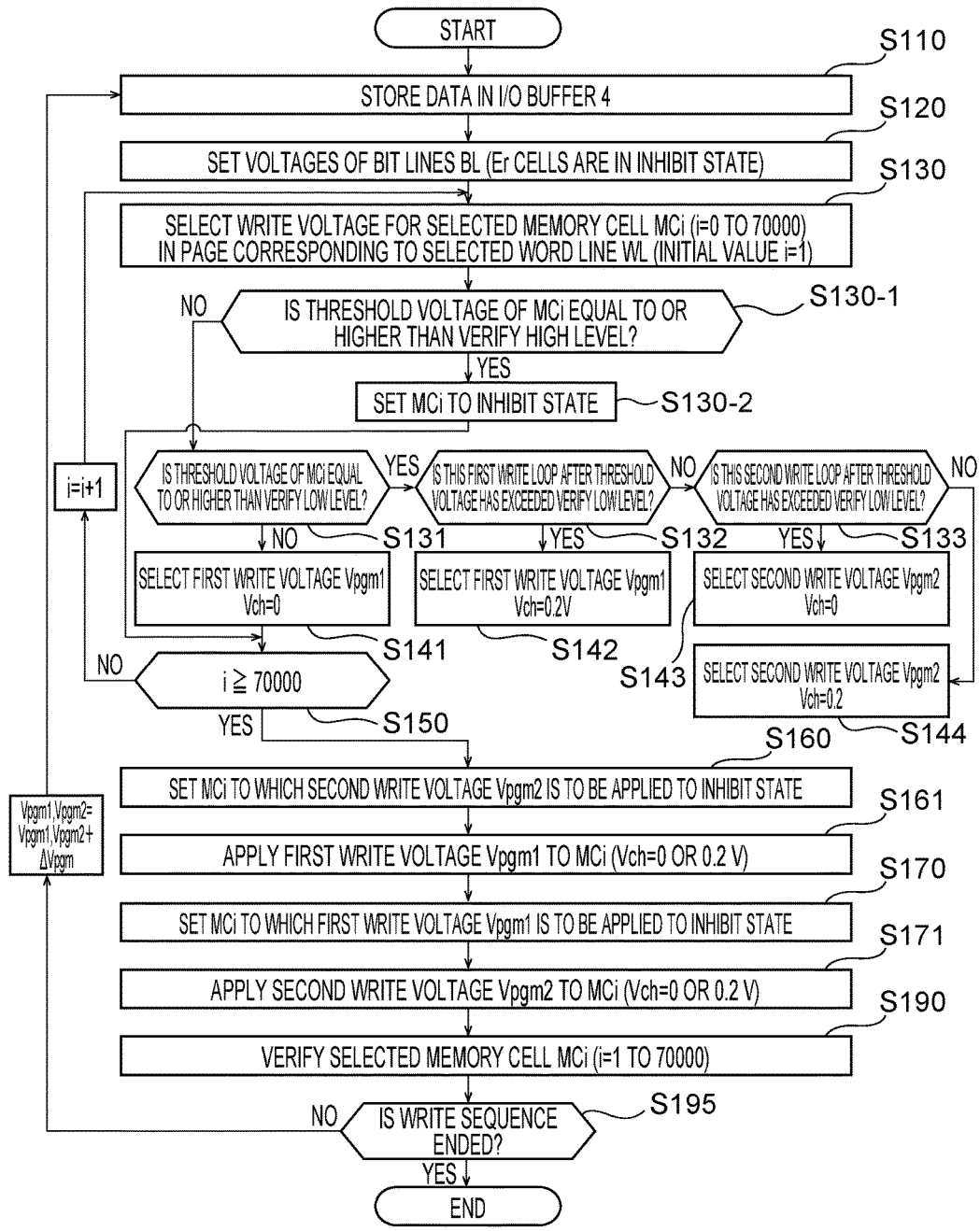
FIG. 7 is a flowchart illustrating an example of the write sequence according to the second embodiment.

FIG. 7 is a flowchart illustrating an example of the write sequence according to the second embodiment. Timings of selection of the write voltage and timings of application of the selected write voltage are explained with reference to FIG. 7. Steps S110 to S130-2 are the same as Steps S10 to S30-2 in the first embodiment, respectively.

When the threshold voltage of the selected memory cell MCi is below the verify high level (NO at Step S130-1), the controller 5 determines whether the threshold voltage of the selected memory cell MCi is equal to or higher than the verify low level (Step S131). When the threshold voltage of the selected memory cell MCi is below the verify low level (NO at Step S131), the controller 5 selects the first write voltage Vpgm1 and keeps the bit line voltage at the source voltage or the ground voltage (Vch=0) (Step S141).

When the threshold voltage of the selected memory cell MCi is equal to or higher than the verify low level and is lower than the verify high level (YES at Step S131), the controller 5 determines whether this is the first write loop after the threshold voltage of the selected memory cell MCi has exceeded the verify low level (Step S132). When this is the first write loop after the threshold voltage of the selected memory cell MCi has exceeded the verify low level (YES at Step S132), the controller 5 selects the first write voltage Vpgm1 and biases the bit line voltage (Vch=0.2 volts) (Step S142).

When this is not the first write loop after the threshold voltage of the selected memory cell MCi has exceeded the verify low level (NO at Step S132), the controller 5 determines whether this is the second write loop after the threshold voltage of the selected memory cell MCi has exceeded the verify low level (Step S133). When this is the second write loop after the threshold voltage of the selected memory cell MCi has exceeded the verify low level (YES at Step S133), the controller 5 selects the second write voltage Vpgm2 and keeps the bit line voltage at the source voltage or the ground voltage (Vch=0) (Step S143).

When this is the third or later write loop after the threshold voltage of the selected memory cell MCi has exceeded the verify low level (NO at Step S133), the controller 5 selects the second write voltage Vpgm2 and biases the bit line voltage (Vch=0.2 volts) (Step S144).

Step S150 is the same as Step S50 in the first embodiment.

In this way, the write voltage Vpgm1 or Vpgm2 and the bit line voltage Vch are determined for each of the selected memory cells MCi on the selected word line WL.

Next, the controller 5 sets selected memory cells MCi to which the second write voltage Vpgm2 is to be applied (including both selected memory cells where Vch=0 volts and selected memory cells where Vch=0.2 volts) to the inhibit state (Step S160). The memory cells set to the inhibit state at Step S130-2 and finally remained as the erase state are kept in the inhibit state.

Next, the word line controller 3 and the bit line controller BLC apply the first write voltage Vpgm1 to selected memory cells MCi other than those in the inhibit state (Step S161). At this time, the bit line controller BLC sets the bit line voltage Vch corresponding to selected memory cells MCi in the case 0 other than those in the inhibit state to 0 volts and sets the bit line voltage Vch corresponding to selected memory cells MCi in the case 1 to 0.2 volts. Accordingly, the word line controller 3 and the bit line controller BLC can selectively apply the first write voltage Vpgm1 to the selected memory cells MC to which the first write voltage Vpgm1 is set to be applied at Step S141.

Subsequently, the controller 5 sets selected memory cells MCi to which the first write voltage Vpgm1 is to be applied (including both selected memory cells where Vch=0 volts and selected memory cells where Vch=0.2 volts) to the inhibit state (Step S170). The memory cells that are set to the inhibit state at Step S130-2 and the memory cells that are finally remained as the erase state are kept in the inhibit state.

Next, the word line controller 3 and the bit line controller BLC apply the second write voltage Vpgm2 to the selected memory cells MCi other than those in the inhibit state (Step S171). At this time, the bit line controller BLC sets the bit line voltage Vch corresponding to selected memory cells MCi in the case 2 other than those in the inhibit state to 0 volts, and sets the bit line voltage Vch corresponding to selected memory cells MCi in the case 3 to 0.2 volts. This enables the word line controller 3 and the bit line controller BLC to selectively apply the second write voltage Vpgm2 to the selected memory cells MC to which the second write voltage Vpgm2 is set to be applied at Step S143.

Steps S190 and S195 are the same as Steps S90 and S95 in the first embodiment.

When the number of selected memory cells MC in which write has not been ended is above a predetermined number, the processing proceeds to the next write loop (NO at Step S195). In this case, the controller 5 increases the first and second write voltages Vpgm1 and Vpgm2 by the step-up widths ΔVpgm, respectively. In the next write loop, the controller 5 brings memory cells MC that have reached the target write states to the inhibit state at Step S130-2.

When the number of selected memory cells MC in which write has not been ended is equal to or lower than the predetermined number, the write sequence ends (YES at Step S195).

As described above, the word line controller 3 and the bit line controller BLC select write voltages corresponding to the threshold voltages of the selected memory cells MC from the write voltages Vpgm1 and Vpgm2 and apply the selected write voltages to the selected memory cells MC, respectively, in the next write loop. Along therewith, the bit line controller BLC selects bit line voltages corresponding to the threshold voltages of the selected memory cells MC from the bit line voltages (0 volts and 0.2 volts) and apply the selected bit line voltages to the selected memory cells MC, respectively, in the next write loop. Also in this way, the second embodiment can provide identical effects to those in the first embodiment.

Instead of two values of 0 volts and 0.2 volts, three or more values can be set as the bit line voltage Vch.

(Third Embodiment)

Figure 8:
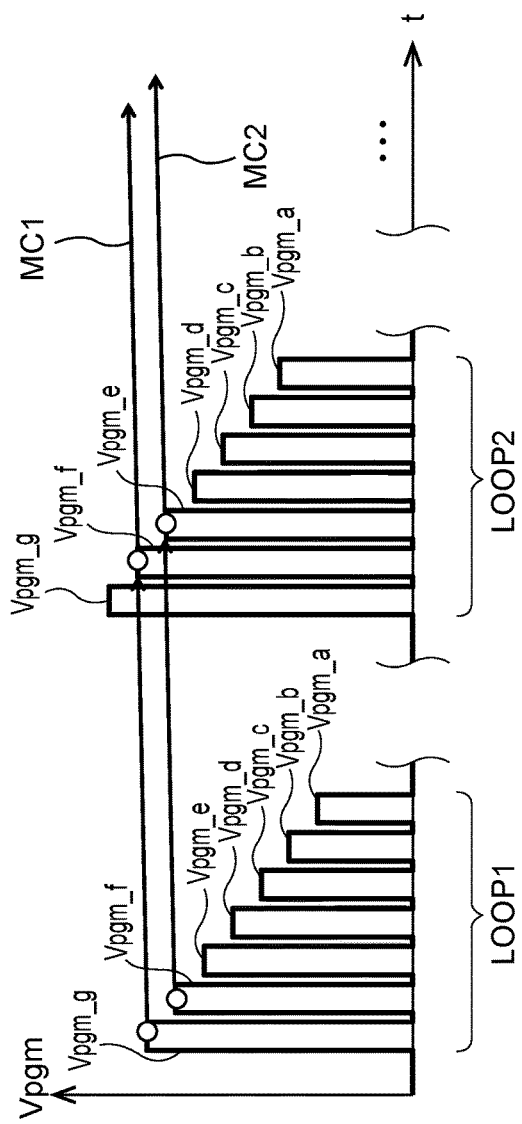
FIG. 8 is a graph illustrating write voltages for a word line according to a third embodiment.

FIG. 8 illustrates write voltages for a word line WL according to a third embodiment. The memory according to the first embodiment selects a write voltage from the write voltages Vpgm1 to Vpgm3 that are arbitrarily set.

In contrast thereto, in the third embodiment, a plurality of write voltages are set to correspond to the states A to G of the target threshold voltages to be written. In this case, as illustrated in FIG. 8, the controller 5 selects a write voltage corresponding to the threshold voltage of each of selected memory cells MC from among a plurality of write voltages Vpgm_a to Vpgm_g corresponding to the states A to G, respectively. The word line controller 3 and the bit line controller BLC apply any of the write voltages Vpgm_a to Vpgm_g to the selected memory cell MC in the next write loop.

The write voltages Vpgm_a to Vpgm_g are normally used for selected memory cells MC corresponding to the states A to G, respectively. For example, the write voltage Vpgm_a is used for selected memory cells MC to which the state A is to be written and the write voltages Vpgm_b to Vpgm_g are not used therefor. The write voltage Vpgm_g is used for selected memory cells MC to which the state G is to be written and the write voltages Vpgm_a to Vpgm_f are not used therefor. The same holds for selected memory cells MC to which the other states B to F are to be written.

In contrast thereto, in the third embodiment, the write voltages Vpgm_a to Vpgm_g are used as the write voltages in the first embodiment. Other operations of the third embodiment are identical to those of the first embodiment.

It suffices that the write voltage is set to correspond to one of the states A to G that is to be written into each of the selected memory cells MC in the write loop LOOP1. For example, it is assumed that target write data to be written into the selected memory cells MC1 and MC2 are the state G and the state F, respectively. In this case, data is written into the selected memory cell MC1 with the write voltage Vpgm_g of the state G and data is written into the selected memory cell MC2 with the write voltage Vpgm_f of the state F in the write loop LOOP1.

It suffices that the write voltages are thereafter lowered step by step after the memory cells have passed the verify low levels of the corresponding write states. For example, it is supposed that the state G is written into the selected memory cell MC1 and the state F is written into the selected memory cell MC2. When the selected memory cell MC1 passes the verify low level G and does not pass the verify high level G in the verify operation of the write loop LOOP1, data is written into the selected memory cell MC1 with the write voltage Vpgm_f in a write loop LOOP2. Thereafter, for example, until the selected memory cell MC1 passes the verify high level G, data is written into the selected memory cell MC1 with the write voltage Vpgm_e in a write loop LOOP3, with the write voltage Vpgm_d in a write loop LOOP4, with the write voltage Vpgm_c in a write loop LOOP5, with the write voltage Vpgm_b in a write loop LOOP6, and with the write voltage Vpgm_a in a write loop LOOP7 and subsequent loops. At a time of having passed the verify high level G, the selected memory cell MC1 becomes the inhibit state in the subsequent write loops.

As for the selected memory cell MC2, for example, when the selected memory cell MC2 passes the verify low level F and does not pass the verify high level F in the verify operation of the write loop LOOP1, data is written into the selected memory cell MC2 with the write voltage Vpgm_e in the write loop LOOP2. Thereafter, for example, until the selected memory cell MC2 passes the verify high level F, data is written into the selected memory cell MC2 with the write voltage Vpgm_d in the write loop LOOP3, with the write voltage Vpgm_c in the write loop LOOP4, with the write voltage Vpgm_b in the write loop LOOP5, and with the write voltage Vpgm_a in the write loop LOOP6 and subsequent loops. At a time of having passed the verify high level F, the selected memory cell MC2 becomes the inhibit state in the subsequent write loops.

The write sequence described above is merely an example and the manners to apply the write voltages Vpgm_a to Vpgm_g can be arbitrarily set.

Also in the third embodiment, the word line controller 3 and the bit line controller BLC select a write voltage corresponding to the threshold voltage of each of selected memory cells MC from among the write voltages Vpgm_a to Vpgm_g and apply the selected write voltage to the selected memory cell MC in the next write loop. Therefore, the third embodiment can provide identical effects to those in the first embodiment.

The bit line voltage Vch can alternatively be kept at the source voltage or the ground voltage. The third embodiment can be combined with the second embodiment. In this case, also the bit line voltage Vch can be selected from one or more values. Further, in this case, the third embodiment can also achieve effects identical to those of the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of word lines;
a plurality of bit lines;
a plurality of memory cells;
a word line controller configured to apply a voltage to a selected word line among the word lines;
a bit line controller configured to apply voltages to the bit lines; and
a detection circuit configured to detect data of the memory cells, wherein
the word line controller and the bit line controller are configured to operate a write sequence of writing data in selected memory cells connected to the selected word line, the write sequence comprising at least one write loop including a write operation of applying a plurality of write voltages, and to operate a verify operation of verifying with the detection circuit whether a threshold voltage of each of the selected memory cells has reached a plurality of reference voltages for corresponding write data, and
the word line controller is configured to select write voltages corresponding to threshold voltages of the selected memory cells, respectively, from among the plurality of write voltages different from each other with respect to each of the write loops, and apply the selected write voltages to the selected memory cells in a subsequent write operation, respectively,
the bit line controller is configured to select a voltage corresponding to the threshold voltages of the selected memory cells, respectively, from among a plurality of bit line voltages different from each other and apply the selected voltage to the selected memory cells via the bit lines in a subsequent write operation,
the number of the write voltages applied to the selected memory cells in each write loop is two or more, the number of bit line voltages applied to the selected memory cells is two or more, the word line controller and the bit line controller are configured to apply a higher word line voltage among the word line voltages and a lower bit line voltage among the bit line voltages to a first memory cell of the selected memory cells in a second write loop after a first write loop, when the threshold voltage of the first memory cell is lower than a verify low level in the first write loop,
the word line controller and the bit line controller are configured to apply a higher word line voltage and a higher bit line voltage to the first memory cell in a third write loop after the second write loop, when the threshold voltage of the first memory cell is higher than the verify low level and lower than a verify high level in the second write loop,
the word line controller and the bit line controller are configured to apply a lower word line voltage and a lower bit line voltage to the first memory cell in a fourth write loop after the third write loop, when the threshold voltage of the first memory cell is still higher than the verify low level and lower than the verify high level in the third write loop, and
the word line controller and the bit line controller are configured to apply a lower word line voltage and a higher bit line voltage to the first memory cell in a fifth write loop after the fourth write loop, when the threshold voltage of the first memory cell is still higher than the verify low level and lower than the verify high level in the fourth write loop.

2. The device of claim 1, wherein
the word line controller is configured to apply a first write voltage and a second write voltage lower than the first write voltage to the selected word line in the write operation,
the word line controller is configured to apply the first write voltage to the selected memory cells in a subsequent write operation when threshold voltages of the selected memory cells are lower than a first reference voltage in the verify operation, and
the word line controller is configured to apply the second write voltage to the selected memory cells in a subsequent write operation when threshold voltages of the selected memory cells are higher than the first reference voltage in the verify operation.

3. The device of claim 2, wherein
the word line controller is configured to increase the write voltages by predetermined values, respectively, each time the write loop is performed in a certain write sequence, and voltage differences between the write voltages in a same write loop are smaller than three times the predetermined value.

4. The device of claim 2, wherein the bit line controller is configured to select a voltage corresponding to the threshold voltages of the selected memory cells, respectively, from among a plurality of bit line voltages different from each other and apply the selected voltage to the selected memory cells via the bit lines in a subsequent write operation.

5. The device of claim 2, wherein the write voltages are set to correspond to target threshold voltages to be written, respectively.

6. The device of claim 1, wherein
the word line controller is configured to increase the write voltages by predetermined values, respectively, each time the write loop is performed in a certain write sequence, and
voltage differences between the write voltages in a same write loop are smaller than three times the predetermined value.

7. The device of claim 6, wherein the bit line controller is configured to select a voltage corresponding to the threshold voltages of the selected memory cells, respectively, from among a plurality of bit line voltages different from each other and apply the selected voltage to the selected memory cells via the bit lines in a subsequent write operation.

8. The device of claim 6, wherein the write voltages are set to correspond to target threshold voltages to be written, respectively.

9. The device of claim 1, wherein
the bit line controller is configured to apply a first bit line voltage, a second bit line voltage higher than the first bit line voltage, or a third bit line voltage higher than the second bit line voltage to the bit lines in the write operation,
the bit line controller is configured to apply the first bit line voltage to ones of the bit lines corresponding to the selected memory cells in a subsequent write operation when threshold voltages of the selected memory cells are lower than the first reference voltage in the verify operation,
the bit line controller is configured to apply the second bit line voltage to ones of the bit lines corresponding to the selected memory cells in a subsequent write operation when threshold voltages of the selected memory cells are higher than the first reference voltage in the verify operation, and
the bit line controller is configured to apply the third bit line voltage to ones of the bit lines corresponding to the selected memory cells in a subsequent write operation when threshold voltages of the selected memory cells respectively have reached target threshold voltages to be written therein in the verify operation.

10. The device of claim 9, wherein
the word line controller increases the write voltages by predetermined values, respectively, each time the write loop is performed in a certain write sequence, and
any of voltage differences between the bit line voltages is smaller than three times the predetermined value.

11. The device of claim 9, wherein the third bit line voltage is higher than a threshold voltage of select transistors provided between the bit lines and the selected memory cells, respectively.

12. The device of claim 1, wherein
the word line controller is configured to increase the write voltages by predetermined values, respectively, each time the write loop is performed in a certain write sequence, and
any of voltage differences between the bit line voltages is smaller than three times the predetermined value.

13. The device of claim 1, wherein the write voltages are set to correspond to target threshold voltages to be written, respectively.

14. The device of claim 1, wherein the bit line controller is configured to apply the highest bit line voltage higher than the higher bit line voltage to the first memory cell in any write loops, when the threshold voltage of the first memory cell is higher than the verify high level.

15. A semiconductor storage device comprising:
a plurality of word lines;
a plurality of bit lines;
a plurality of memory cells;
a word line controller configured to apply a voltage to a selected word line among the word lines;
a bit line controller configured to apply voltages to the bit lines; and
a detection circuit configured to detect data of the memory cells, wherein
the word line controller and the bit line controller are configured to operate a write sequence of writing data in selected memory cells connected to the selected word line, the write sequence comprising at least one write loop including a write operation of applying a plurality of write voltages, and to operate a verify operation of verifying with the detection circuit whether a threshold voltage of each of the selected memory cells has reached a plurality of reference voltages for corresponding write data, and
the word line controller is configured to select write voltages corresponding to threshold voltages of the selected memory cells, respectively, from among the plurality of write voltages different from each other with respect to each of the write loops, and apply the selected write voltages to the selected memory cells in a subsequent write operation, respectively,
the bit line controller is configured to select a voltage corresponding to the threshold voltages of the selected memory cells, respectively, from among a plurality of bit line voltages different from each other and apply the selected voltage to the selected memory cells via the bit lines in a subsequent write operation,
the number of the write voltages applied to the selected memory cells in each write loop is two, the number of bit line voltages applied to the selected memory cells is three, the word line controller and the bit line controller are configured to apply a higher word line voltage among the two word line voltages and the lowest bit line voltage among the three bit line voltages to a first memory cell of the selected memory cells in a second write loop after a first write loop, when the threshold voltage of the first memory cell is lower than a verify low level in the first write loop,
the word line controller and the bit line controller are configured to apply the higher word line voltage and a middle bit line voltage to the first memory cell in a third write loop after the second write loop, when the threshold voltage of the first memory cell is higher than the verify low level and lower than a verify high level in the second write loop,
the word line controller and the bit line controller are configured to apply a lower word line voltage and the lowest bit line voltage to the first memory cell in a fourth write loop after the third write loop, when the threshold voltage of the first memory cell is still higher than the verify low level and lower than the verify high level in the third write loop, the word line controller and the bit line controller are configured to apply the lower word line voltage and the middle bit line voltage to the first memory cell in a fifth write loop after the fourth write loop, when the threshold voltage of the first memory cell is still higher than the verify low level and lower than the verify high level in the fourth write loop, and the word line controller and the bit line controller are configured to apply either one of the two word line voltage and the highest bit line voltage to the first memory cell in any write loops, when the threshold voltage of the first memory cell is higher than the verify high level.

* * * * *